(12) United States Patent
Choi et al.

(10) Patent No.: US 7,306,552 B2
(45) Date of Patent: Dec. 11, 2007

(54) SEMICONDUCTOR DEVICE HAVING LOAD RESISTOR AND METHOD OF FABRICATING THE SAME

(75) Inventors: Eun-Young Choi, Gyeonggi-do (KR); Eun-Jin Baek, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 122 days.

(21) Appl. No.: 11/292,633

(22) Filed: Dec. 2, 2005

(65) Prior Publication Data
US 2006/0118909 A1   Jun. 8, 2006

(30) Foreign Application Priority Data
Dec. 3, 2004   (KR) .................... 10-2004-0101345
Apr. 6, 2005   (KR) .................... 10-2005-0028653

(51) Int. Cl.
*H01L 21/20*   (2006.01)
(52) U.S. Cl. .................. 483/381; 257/E21.004; 438/382; 438/384
(58) Field of Classification Search .............. 438/264, 438/296, 594; 257/499
See application file for complete search history.

(56) References Cited

U.S. PATENT DOCUMENTS 5,677,557 A * 10/1997 Wuu et al. ............... 257/382
6,054,385 A * 4/2000 Gardner et al. .......... 438/655
6,391,722 B1 * 5/2002 Koh ......................... 438/264
2005/0056895 A1 * 3/2005 Shimizu et al. .......... 257/355

FOREIGN PATENT DOCUMENTS

JP   11-121719    4/1999
KR   1999-024779  4/1999

OTHER PUBLICATIONS

English language abstract of Korean Publication No. 1999-024779.
English language abstract of Japanese Publication No. 11-121719.

* cited by examiner

*Primary Examiner*—Matthew Smith
*Assistant Examiner*—Ankush Singal
(74) *Attorney, Agent, or Firm*—Marger Johnson & McCollom, P.C.

(57) ABSTRACT

A semiconductor device includes a semiconductor substrate having a resistor region, an isolation layer disposed in the resistor region, the isolation layer defining active regions, first conductive layer patterns disposed on the active regions, a second conductive layer pattern covering the first conductive layer patterns and disposed on the isolation layer, the second conductive layer pattern and the first conductive layer patterns constituting a load resistor pattern, an upper insulating layer disposed over the load resistor pattern, and resistor contact plugs disposed over the active regions, the resistor contact plugs penetrating the upper insulating layer to contact the load resistor pattern.

11 Claims, 31 Drawing Sheets

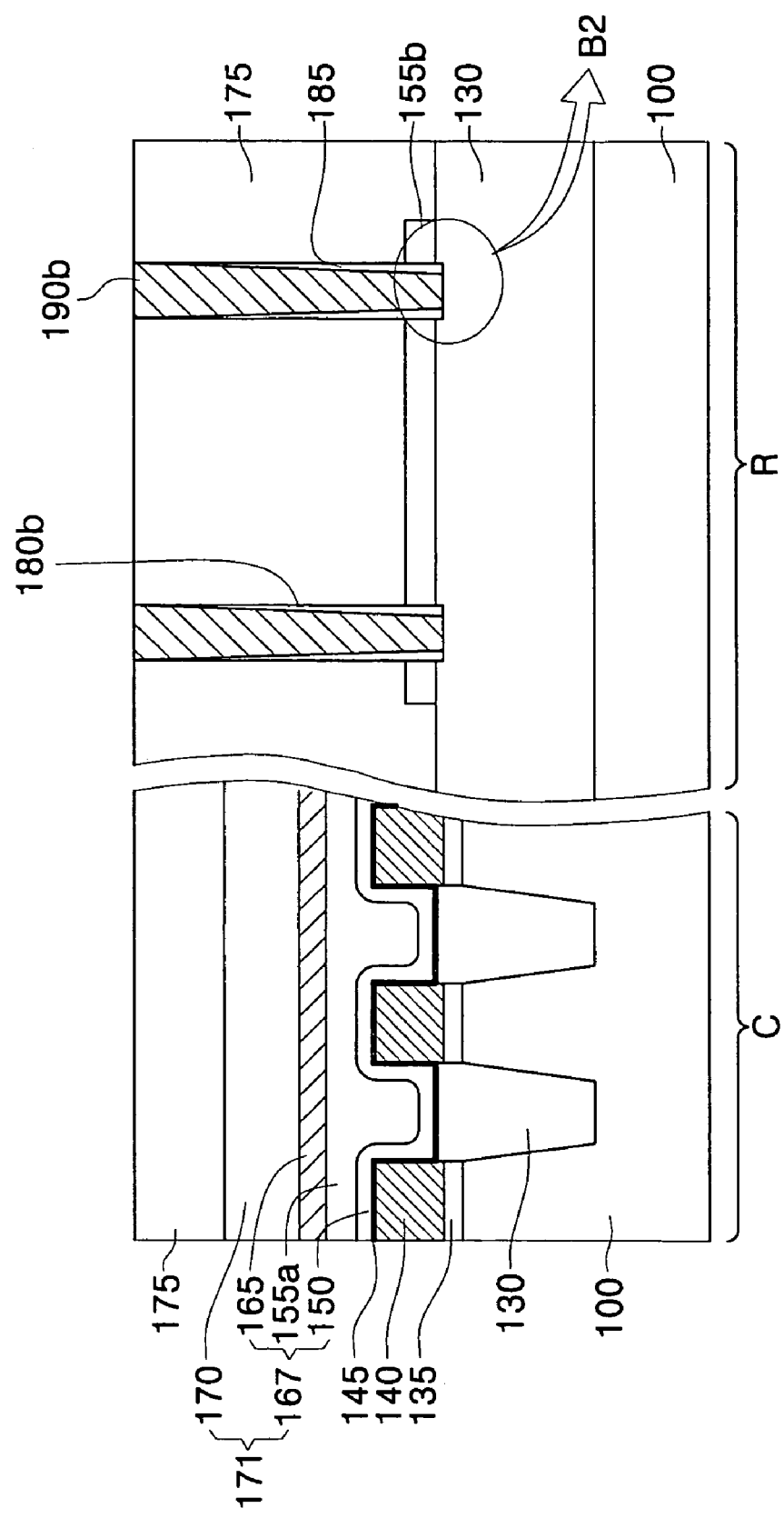

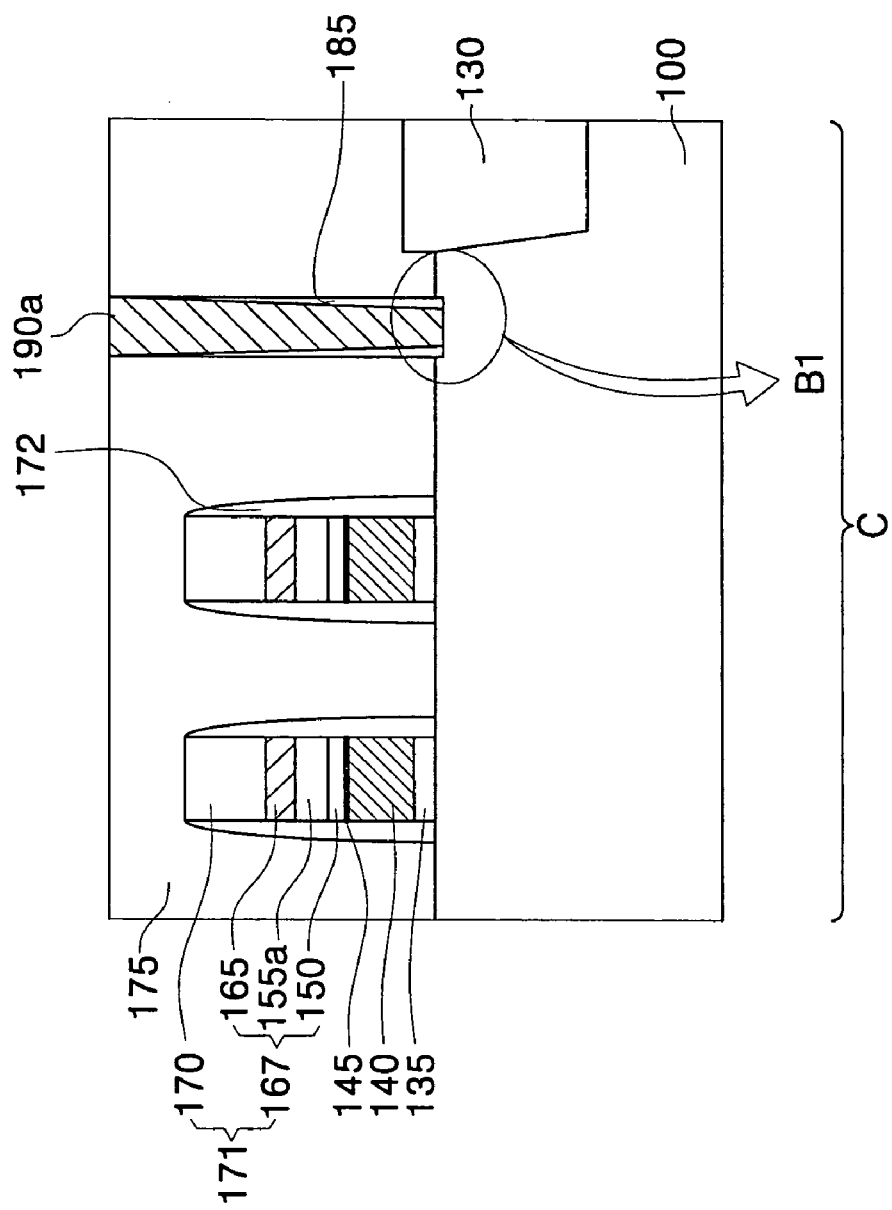

SEMICONDUCTOR DEVICE HAVING LOAD RESISTOR AND METHOD OF FABRICATING THE SAME

CROSS-REFERENCE TO RELATED APPLICATIONS

This application claims priority from Korean Patent Application No. 10-2004-0101345, which was filed on 3 Dec. 2004, and claims priority from Korean Patent Application No. 10-2005-0028653, which was filed on 6 Apr. 2005. The disclosures of the Korean Patent Applications identified above are incorporated by reference in their entirety.

BACKGROUND

1. Field of the Invention

This disclosure relates to semiconductor devices and more particularly, to a semiconductor device having a load resistor and a method of fabricating the same.

2. Description of the Related Art

In recent years, semiconductor devices such as nonvolatile memory devices have been widely used in electronic products like computers and digital cameras. Nonvolatile memory devices are memory devices that can electrically erase or program data. A memory cell of the nonvolatile memory device typically has a floating gate, which is used as a charge storage layer, and a control gate, which is used to control input and output signals.

The nonvolatile memory device further includes delay circuits, high-voltage stabilizing circuits for writing/erasing, and reference voltage generating circuits to perform various operations. These circuits generally require a resistor device, which has a resistor characteristic. In order to promote efficiency during the fabrication of the chip, the resistor device and the memory cell are formed using very similar processes.

As the integration density of semiconductor devices increase, the design rule must decrease. Thus, a floating gate polysilicon layer for a nonvolatile memory device is typically formed by a self-aligned polysilicon (SAP) process. In the SAP process, when an active region and an isolation layer are formed, a floating gate polysilicon layer is formed on the active region at the same time. The floating gate polysilicon layer is formed only on the active region. As a result, when a resistor device is required on the isolation layer, it is not possible to use the floating gate polysilicon layer as a resistor device. Rather, a control gate polysilicon layer is typically used.

FIG. 1A is a plan diagram illustrating a conventional nonvolatile memory device, FIG. 1B is a sectional diagram taken along the line X-X' of FIG. 1A, and FIG. 1C is a sectional diagram taken along the line Y-Y' of FIG. 1A.

Referring to FIGS. 1A, 1B and 1C, a cell region C and a resistor region R are prepared in a semiconductor substrate 100. An isolation layer 130 is disposed in the semiconductor substrate 100 to define an active region A. The isolation layer 130 may be a trench isolation layer. The active region A is disposed across the cell region C. The semiconductor substrate 100 in the resistor region R is covered with the isolation layer 130.

A gate oxide layer 135 is disposed on the active region A. In the cell region C, a floating gate electrode 140, an oxide-nitride-oxide (ONO) layer pattern 145, a control gate electrode 167, and a gate hard mask pattern 170 are sequentially stacked on the semiconductor substrate 100 having the gate oxide layer 135. Meanwhile, a stacked gate structure including the floating gate electrode 140, the ONO layer pattern 145, and the control gate electrode 167 may be formed. Also, the control gate electrode 167 and the gate hard mask pattern 170 constitute word line patterns 171. Gate spacers 172 are disposed on sidewalls of the word line patterns 171 and the floating gate electrode 140. The ONO layer pattern 145, the control gate electrode 167, and the gate hard mask pattern 170 are disposed across the active region A in the cell region C, and the floating gate electrode 140 is disposed in a region where the control gate electrode 167 overlaps the active region A.

The control gate electrode 167 includes a first control gate pattern 150, a second control gate pattern 155a, and a gate conductive layer pattern 165, which are sequentially stacked. The first and second control gate patterns 150 and 155a may be formed of a polysilicon layer. The gate conductive layer pattern 165 may be formed of a metal silicide layer, such as a tungsten silicide layer, a cobalt silicide layer, or a nickel silicide layer.

A load resistor pattern 155b is disposed on the isolation layer 130 in the resistor region R. The load resistor pattern 155b is formed to the same thickness using the same material layer as the second control gate pattern 155a. A planarized interlayer insulating layer 175 is disposed on the semiconductor substrate 100 having the word line pattern 171 and the load resistor pattern 155b. A bit line contact plug 190a is disposed in the cell region C to be in contact with the cell active region A through the planarized interlayer insulating layer 175. A resistor contact plug 190b is disposed in the resistor region R to be in contact with the load resistor pattern 155b through the planarized interlayer insulating layer 175. A spacer nitride layer 185 may be disposed to cover sidewalls of the bit line contact plug 190a and the resistor contact plug 190b.

The load resistor pattern 155b is formed to the same thickness using the same layer as the second control gate pattern 155a. Conventionally, the second control gate pattern 155a is formed to a thickness of about 500 Å, thus the load resistor pattern 155b is also formed to the same thickness as the second control gate pattern 155a. The bit line contact plug 190a and the resistor contact plug 190b are formed at the same time. In this case, as can be seen in region 'B1' of FIG. 1C, the bit line contact plug 190a is formed in the condition that the semiconductor substrate 100 is recessed to a depth of 200 to 300 Å. Accordingly, when the resistor contact plug 190b is formed at the same time as the bit line contact plug 190a, a contact margin becomes insufficient because of a small thickness of the load resistor pattern 155b that is formed of the same layer as the second control gate pattern 155a.

As a result, as can be seen in region 'B2' of FIG. 1B, due to the insufficient contact margin, the contact plug 190b may be formed through the load resistor pattern 155b and come into contact with the isolation layer 130. Accordingly, an electrical contact of the resistor contact plug 190b with the load resistor pattern 155b is formed only through a lateral surface of the resistor contact plug 190b, so that contact resistance increases. Also, when the spacer nitride layer 185 is formed to cover the sidewalls of the contact plugs 190a and 190b to enhance electrical properties of the contact plugs 190a and 190b, the resistor contact plug 190b and the load resistor pattern 155b have no electrical connection, thus resulting in contact failures.

Embodiments of the invention address these and other disadvantages of the related art.

SUMMARY

According to some embodiments of the invention, a semiconductor device has a load resistor pattern that includes a polysilicon layer, the load resistor pattern self-aligned with an active region. According to some embodiments, a nonvolatile memory device has a load resistor pattern that includes a polysilicon layer, the load resistor pattern self-aligned with an active region.

Other embodiments of the invention include a method of fabricating the above-described semiconductor device and the above-described nonvolatile memory device. According to some embodiments, a nonvolatile memory device may be fabricated to prevent contact failures of resistor devices while still making use of a SAP process.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

FIG. 1B is a sectional diagram taken along the line X-X' of FIG. 1A.

FIG. 1C is a sectional diagram taken along the line Y-Y' of FIG. 1A.

DETAILED DESCRIPTION

Figure 1A:
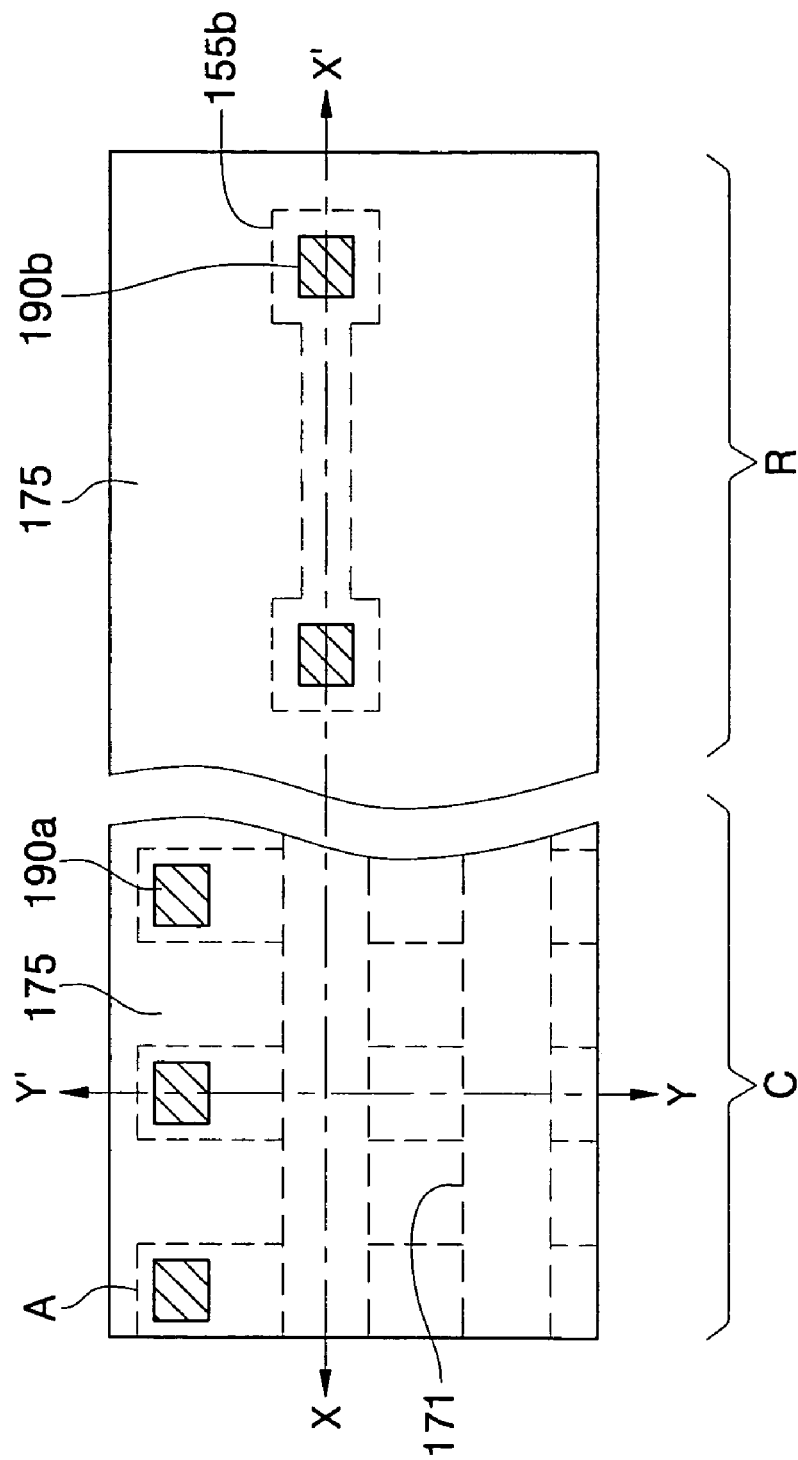
FIG. 1A is a plan diagram illustrating a conventional nonvolatile memory device.

The principles of the invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. In the drawings, the thicknesses of layers and regions are exaggerated for clarity. The same reference numerals are used to denote the same elements.

Although the exemplary embodiments described below illustrate a nonvolatile memory device, the principles of the invention may be applied to all semiconductor devices that are fabricated using SAP process.

Figure 2A:
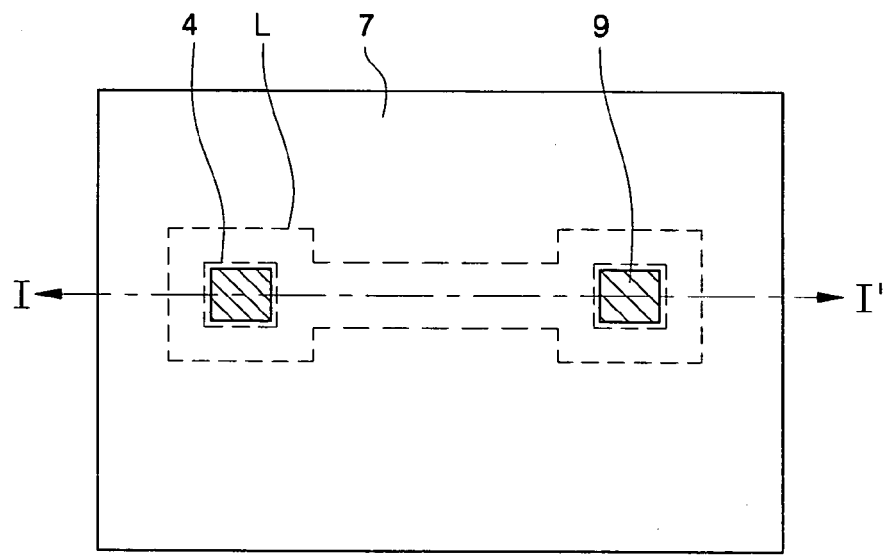
FIG. 2A is a plan diagram illustrating a nonvolatile memory device according to some embodiments of the invention.
Figure 2B:
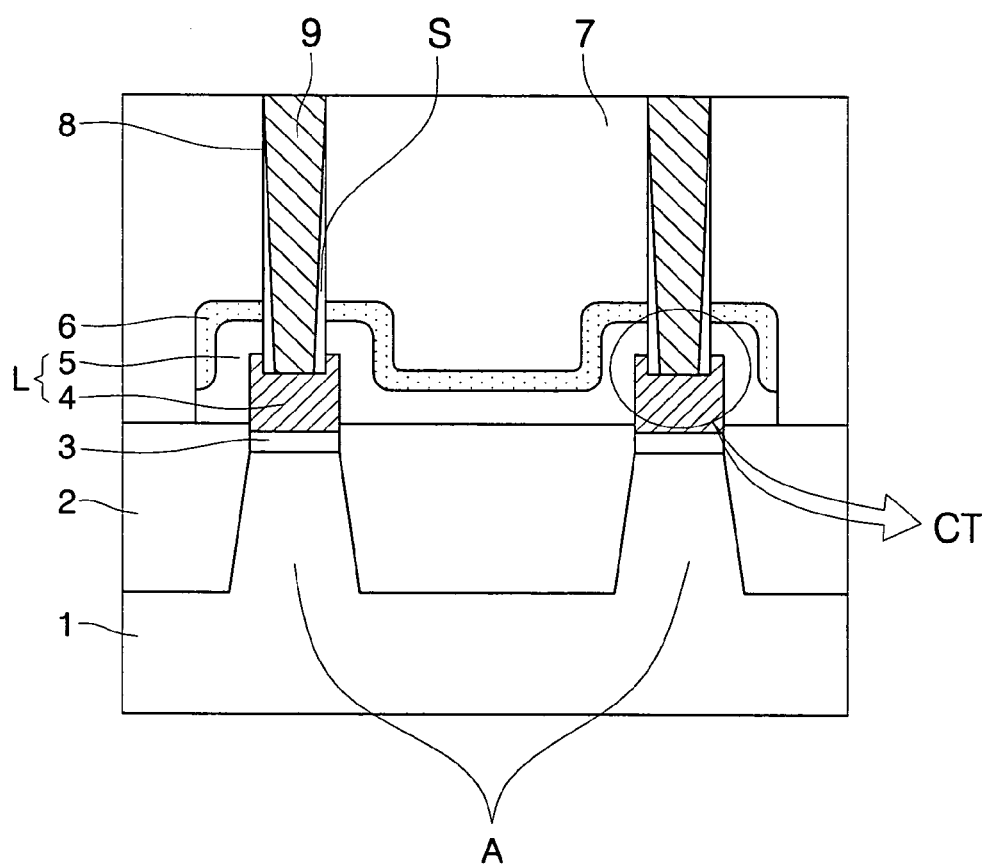
FIG. 2B is a sectional diagram taken along the line I-I' of FIG. 2A.

FIG. 2A is a plan diagram illustrating a nonvolatile memory device according to some embodiments of the invention. FIG. 2B is a sectional diagram taken along the line I-I' of FIG. 2A.

Referring to FIGS. 2A and 2B, an isolation layer 2 is disposed in a semiconductor substrate 1 to define at least a pair of active regions A. The isolation layer 2 may be a trench isolation layer. The active regions A are disposed in regions where contacts will be formed in a subsequent process. A lower insulating layer 3 may be disposed on the active regions A. The lower insulating layer 3 may be a high-voltage gate oxide layer. First conductive layer patterns 4 are disposed on the lower insulating layer 3.

When the principles of the invention are applied to a nonvolatile memory device, the first conductive layer patterns 4 may be formed of the same material layer as floating gate patterns of nonvolatile memory cells. The first conductive layer patterns 4 are provided on the active regions A and self-aligned with the isolation layer 2. The first conductive layer patterns 4 may be formed to a thickness of about 500 to 1000 Å using a polysilicon layer.

A second conductive layer pattern 5 is disposed on the isolation layer 2 and covers the first conductive layer patterns 4. The second conductive layer pattern 5 may be the same material layer as control gate electrodes of the nonvolatile memory cells. The second conductive layer pattern 5 may include a polysilicon layer and have a thickness of about 200 to 700 Å.

The first conductive layer patterns 4 and the second conductive layer pattern 5 constitute a load resistor pattern L. A resistor mask pattern 6 may be disposed on the load resistor pattern L. Sidewalls of the load resistor pattern L may be self-aligned with sidewalls of the resistor mask pattern 6. The resistor mask pattern 6 may be a silicon oxide layer. Specifically, the resistor mask pattern 6 may be a medium temperature oxide (MTO) layer.

A planarized interlayer insulating layer 7 is disposed on the semiconductor substrate 1 having the resistor mask pattern 6. Resistor contact holes 8 are disposed through the planarized interlayer insulating layer 7 and the resistor mask pattern 6. The resistor contact holes 8 are disposed over the active regions A. The resistor contact holes 8 are filled with resistor contact plugs 9 that are in contact with the load resistor pattern L. The resistor contact plugs 9 may be in contact with the first conductive layer patterns 4 through the second conductive layer pattern 5. Spacer nitride layers S may be disposed to cover sidewalls of the resistor contact plug 9.

The load resistor pattern L includes the first conductive layer patterns 4 and the second conductive layer pattern 5 in regions where the load resistor pattern L contacts the resistor contact plugs 9. As can be seen in the region 'CT' of FIG. 2B, the resistor contact plugs 9 may be in contact with the first conductive layer patterns 4 through the second conductive layer pattern 5. Accordingly, compared to conventional techniques, a possibility that the resistor contact plugs 9 will contact the active regions A (i.e., the semiconductor substrate 1) may be significantly reduced.

FIGS. 3A, 4A, 5A, 6A, 7A, 8A, 9A, 10A, 11A, 12A, 13A and 14A are plan diagrams illustrating a method of fabricating a nonvolatile memory device according to some embodiments of the invention.

FIGS. 3B, 4B, 5B, 6B, 7B, 8B, 9B, 10B, 11B, 12B, 13B and 14B are sectional diagrams taken along the lines X-X' of FIGS. 3A, 4A, 5A, 6A, 7A, 8A, 9A, 10A, 11A, 12A, 13A and 14A, respectively.

FIGS. 3C, 4C, 5C, 6C, 7C, 8C, 9C, 10C, 11C, 12C, 13C and 14C are sectional diagrams taken along lines Y-Y' of FIGS. 3A, 4A, 5A, 6A, 7A, 8A, 9A, 10A, 11A, 12A, 13A and 14A, respectively.

Figure 3A:
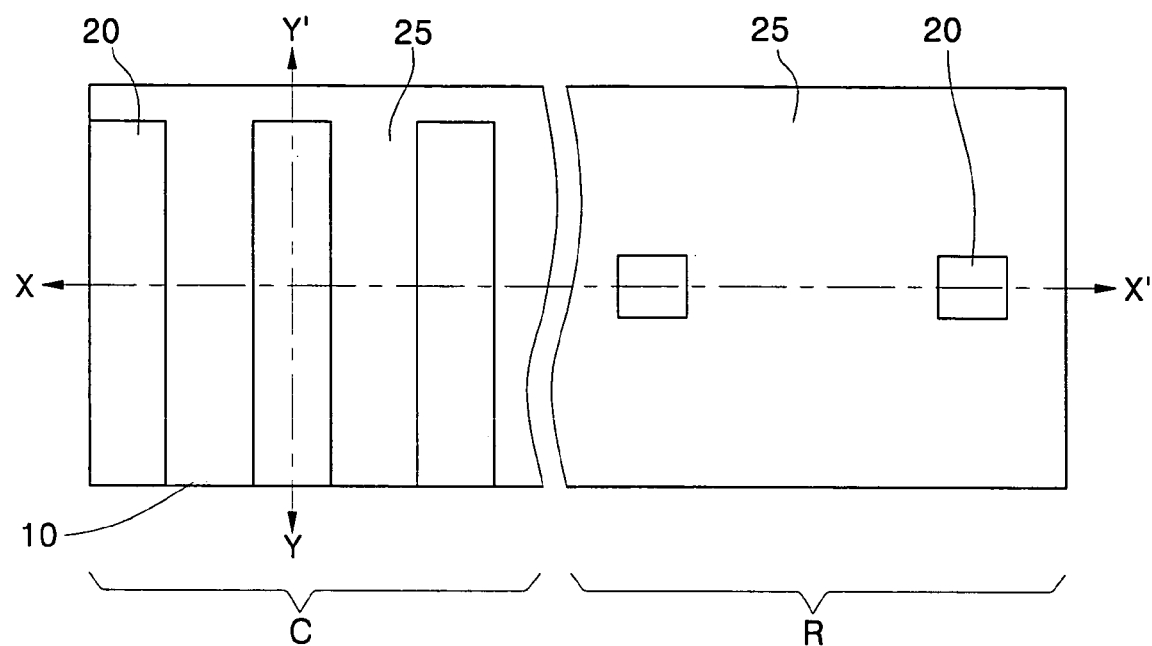
FIGS. 3A, 4A, 5A, 6A, 7A, 8A, 9A, 10A, 11A, 12A, 13A and 14A are plan diagrams illustrating a method of fabricating a nonvolatile memory device according to some embodiments of the invention.
Figure 3B:
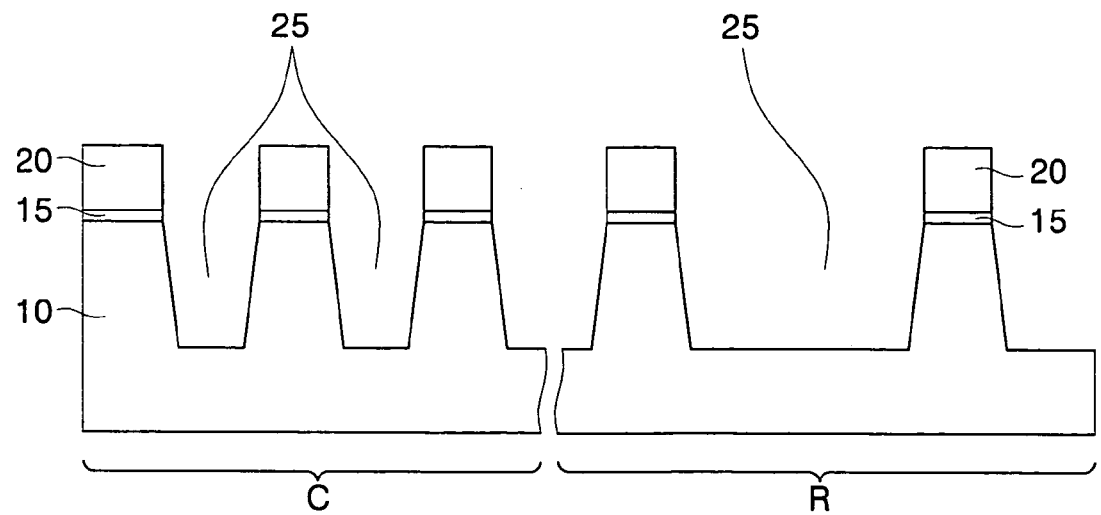
FIGS. 3B, 4B, 5B, 6B, 7B, 8B, 9B, 10B, 11B, 12B, 13B and 14B are sectional diagrams taken along the lines X-X' of FIGS. 3A, 4A, 5A, 6A, 7A, 8A, 9A, 10A, 11A, 12A, 13A and 14A, respectively.
Figure 3C:
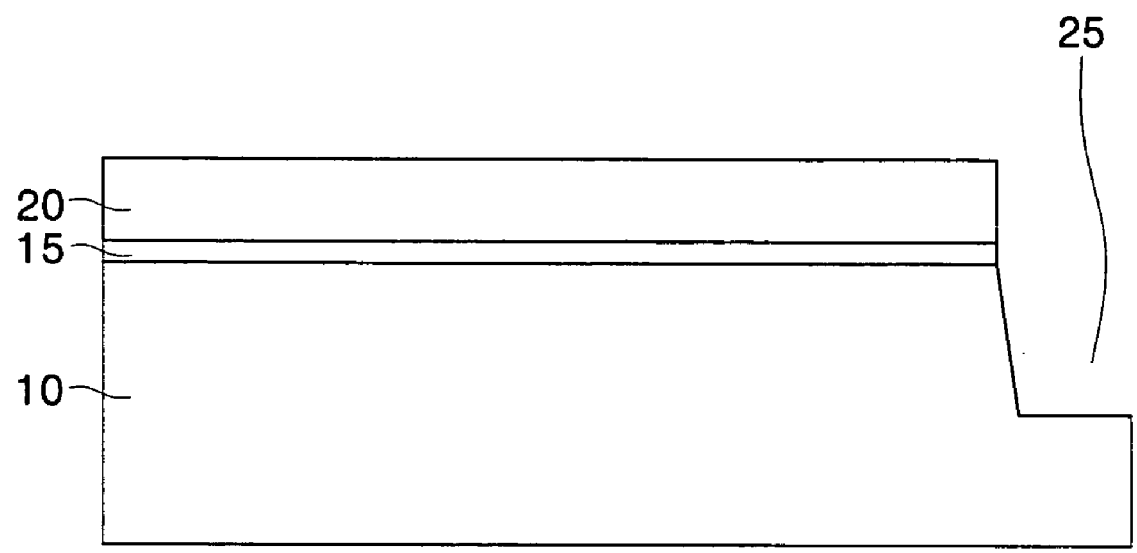
FIGS. 3C, 4C, 5C, 6C, 7C, 8C, 9C, 10C, 11C, 12C, 13C and 14C are sectional diagrams taken along lines Y-Y' of FIGS. 3A, 4A, 5A, 6A, 7A, 8A, 9A, 10A, 11A, 12A, 13A and 14A, respectively.

Referring to FIGS. 3A, 3B and 3C, a cell region C and a resistor region R are disposed in a semiconductor substrate 10. A pad oxide layer and a hard mask layer are sequentially formed on a surface of the semiconductor substrate 10. Thereafter, the hard mask layer is patterned, thereby forming a hard mask pattern 20 having an opening that exposes the pad oxide layer. The hard mask pattern 20 may be formed of a silicon nitride layer. The pad oxide layer, which is exposed by the opening and the semiconductor substrate 20 are sequentially etched using the hard mask pattern 20 as an etch mask, thereby forming a pad oxide layer pattern 15 and a trench 25.

Figure 4A:
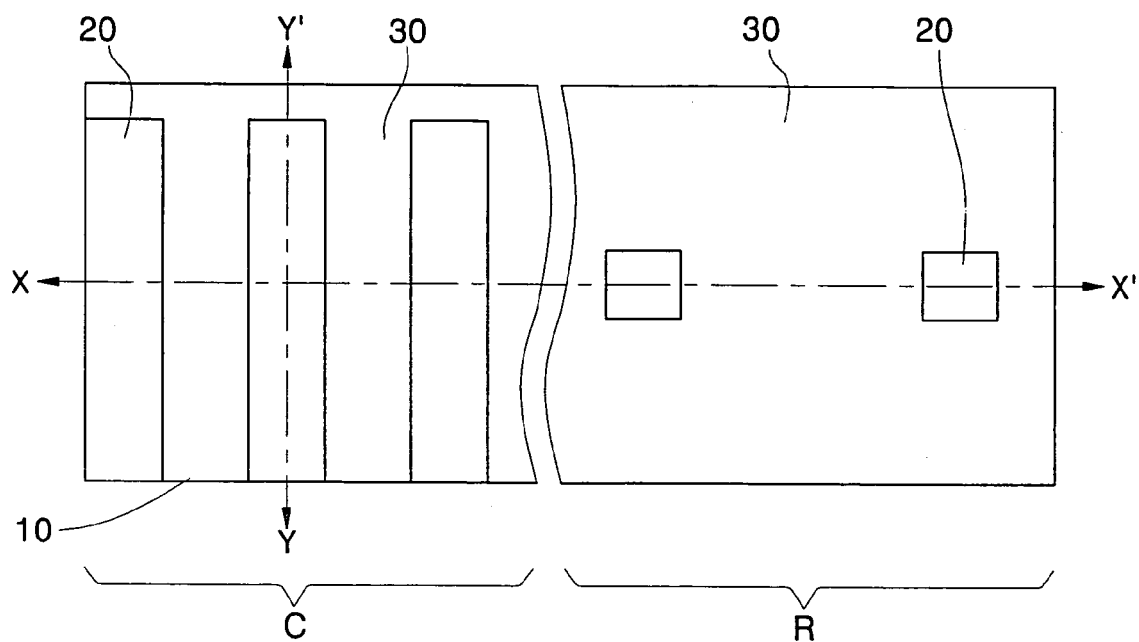
Figure 4B:
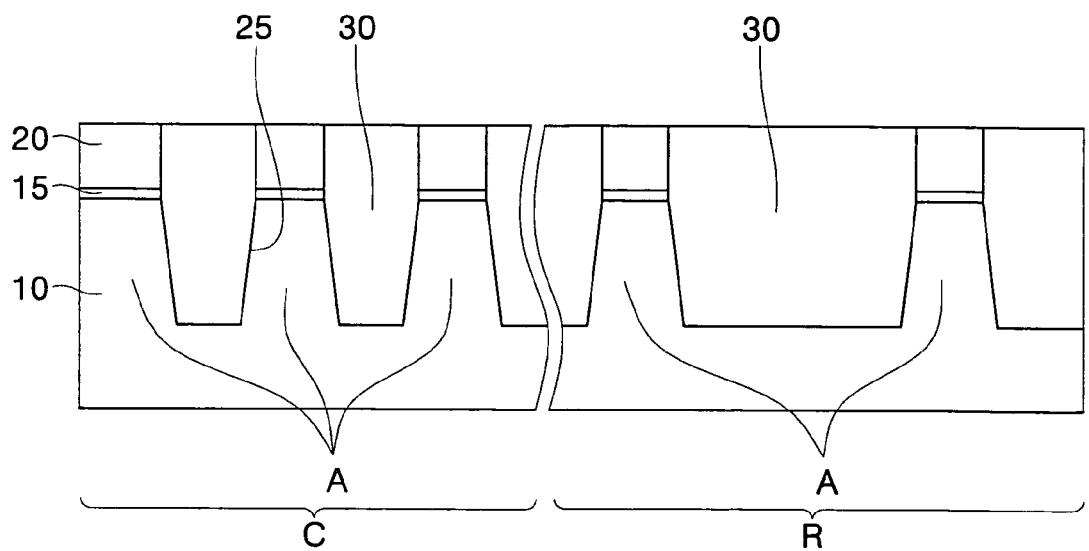
Figure 4C:
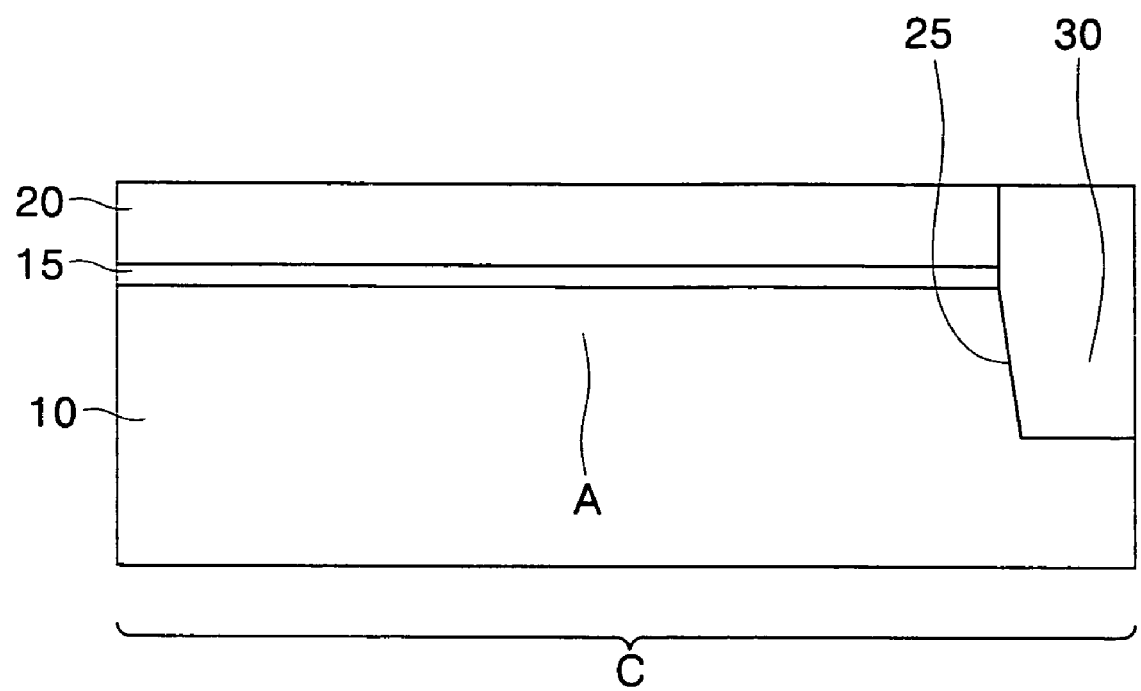

Referring to FIGS. 4A, 4B and 4C, a trench isolation layer is formed on the semiconductor substrate 10 having the hard mask pattern 20 and the trench 25 to fill the opening and the trench 25. The trench isolation layer may be an oxide layer. The trench isolation layer is planarized until the hard mask pattern 20 is exposed. As a result, a trench isolation layer 30 that fills the opening and the trench 25 is formed to define an active region A. Unlike the active region A formed in the cell region C, the active region A formed in the resistor region R is formed only in a portion where a contact will be formed in a subsequent process.

Figure 5A:
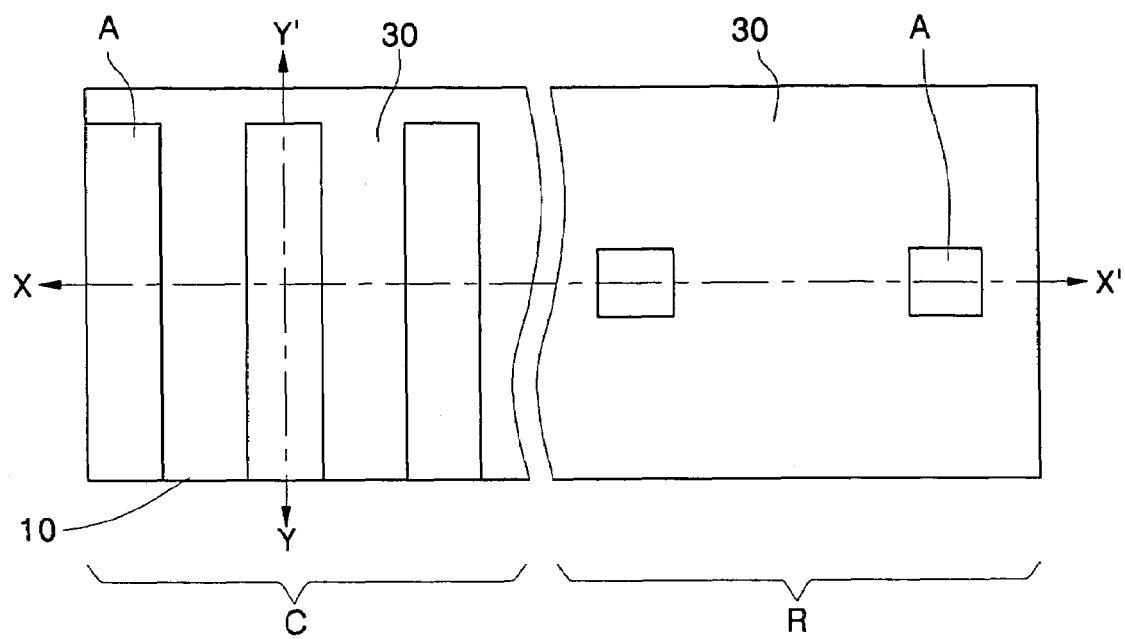
Figure 5B:
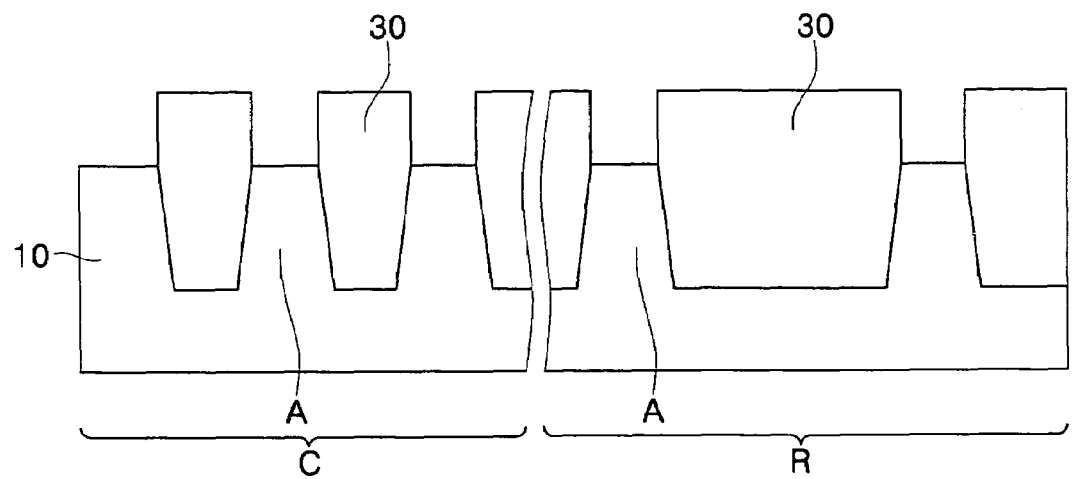
Figure 5C:
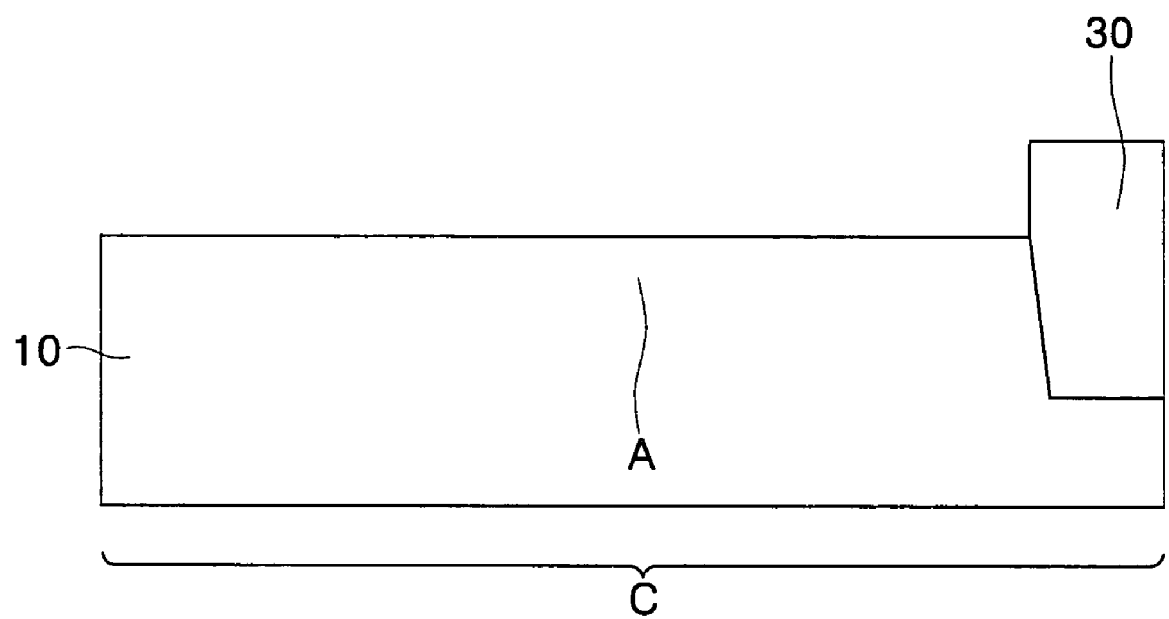

Referring to FIGS. 5A, 5B and 5C, the hard mask pattern 20 is selectively removed by a wet etching process. When the hard mask pattern 20 is formed of a silicon nitride layer, it may be selectively removed using a phosphoric acid (H$_3$PO$_4$) solution. The pad oxide layer 15 is selectively removed by a wet etching process. As a result, the trench isolation layer 30 protrudes from the semiconductor substrate 10 as shown in FIG. 5B.

Figure 6A:
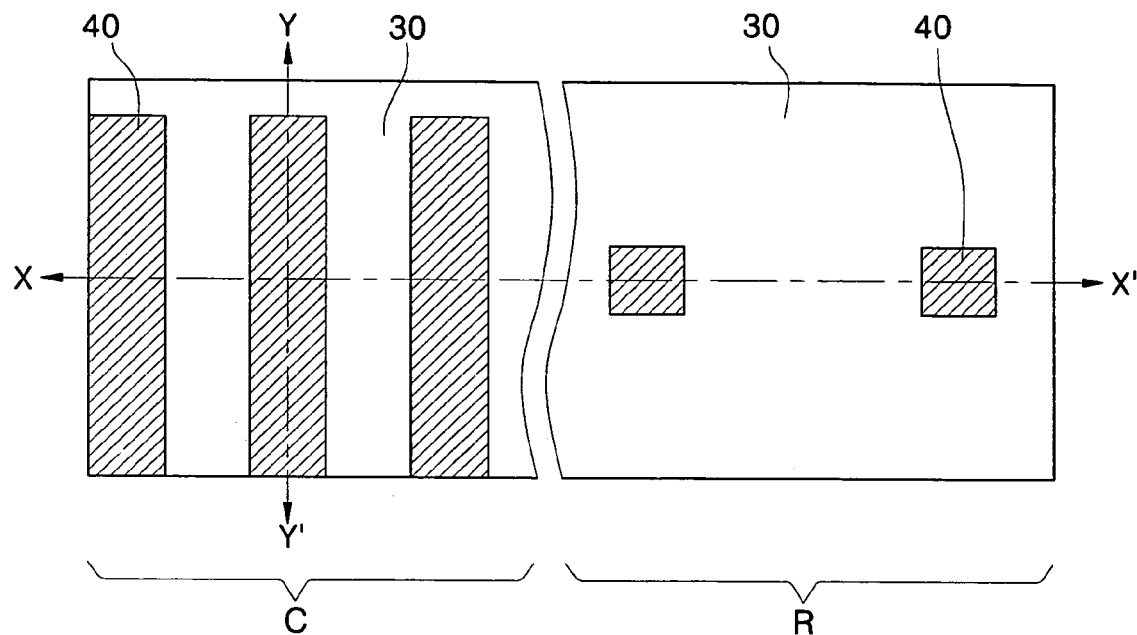
Figure 6B:
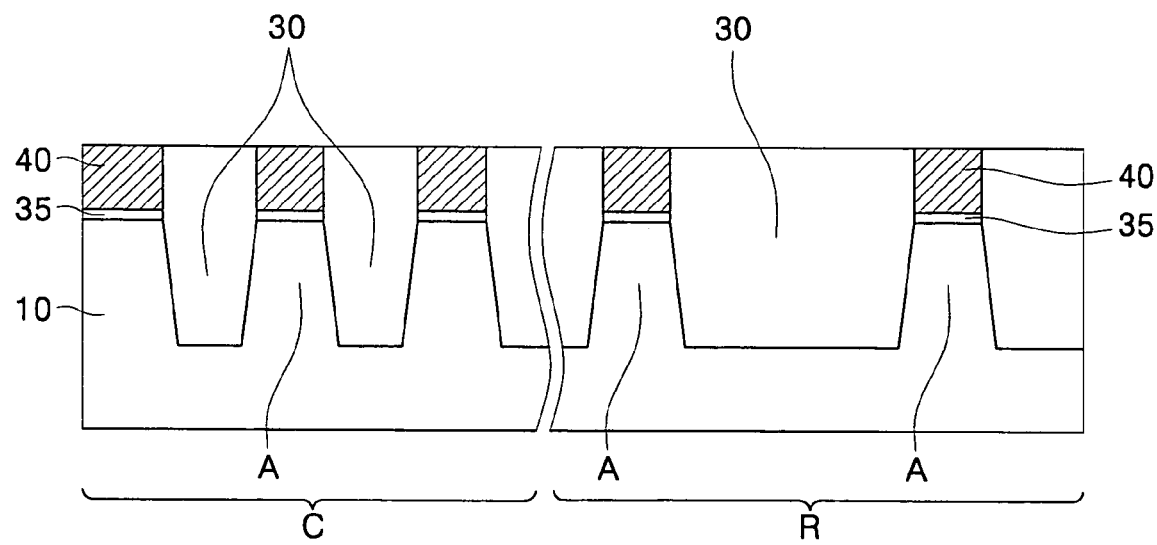
Figure 6C:
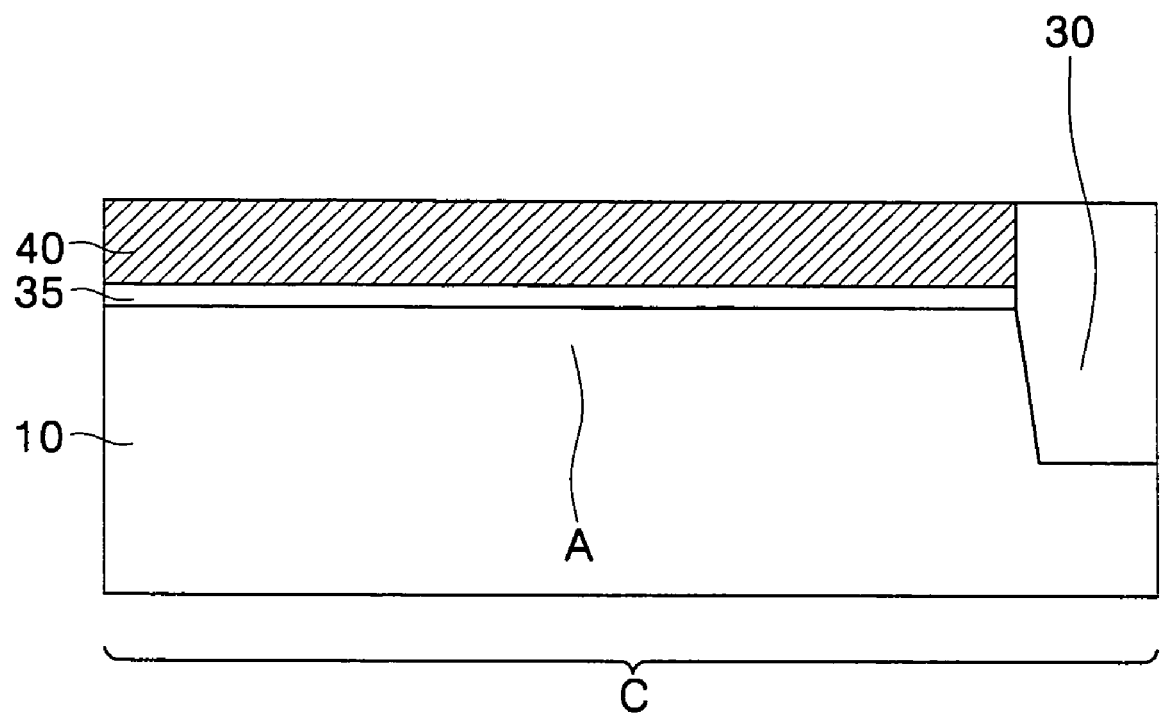

Referring to FIGS. 6A, 6B and 6C, the semiconductor substrate 10 is thermally oxidized, thereby forming a gate oxide layer 35 on the semiconductor substrate 10, i.e., on the active regions A. It should be recognized that the gate oxide layer 35 is a specific example of a gate insulating layer, which, generally speaking, is not limited to an oxide layer. The gate oxide layer 35 formed in the resistor region R may be a high-voltage gate oxide layer having a thickness greater than the gate oxide layer 35 formed in the cell region C. A first conductive layer, i.e., a floating gate layer, is formed on the semiconductor substrate 10 having the gate oxide layer 35. The floating gate layer may be composed of polysilicon or may include polysilicon. The floating gate layer is planarized until the surface of the trench isolation layer 30 is exposed. As a result, first conductive layer patterns 40, i.e., floating gate patterns are formed on the active regions A. Accordingly, the floating gate patterns 40 in the cell and resistor regions C and R may be disposed in a self-aligned fashion on the active regions A by the trench isolation layer 30.

The above-described process of forming the floating gate patterns 40 is referred to as a self-aligned polysilicon (SAP) process. The floating gate patterns 40 may be formed to a thickness of about 500 to 1000 Å. In this case, the thickness of the floating gate patterns 40 depends on the thickness of the hard mask patterns 20. Accordingly, in FIGS. 3A through 3C, the hard mask patterns 20 should be formed to a thickness that is equal to or greater than the required thickness of the floating gate patterns 40.

Figure 7A:
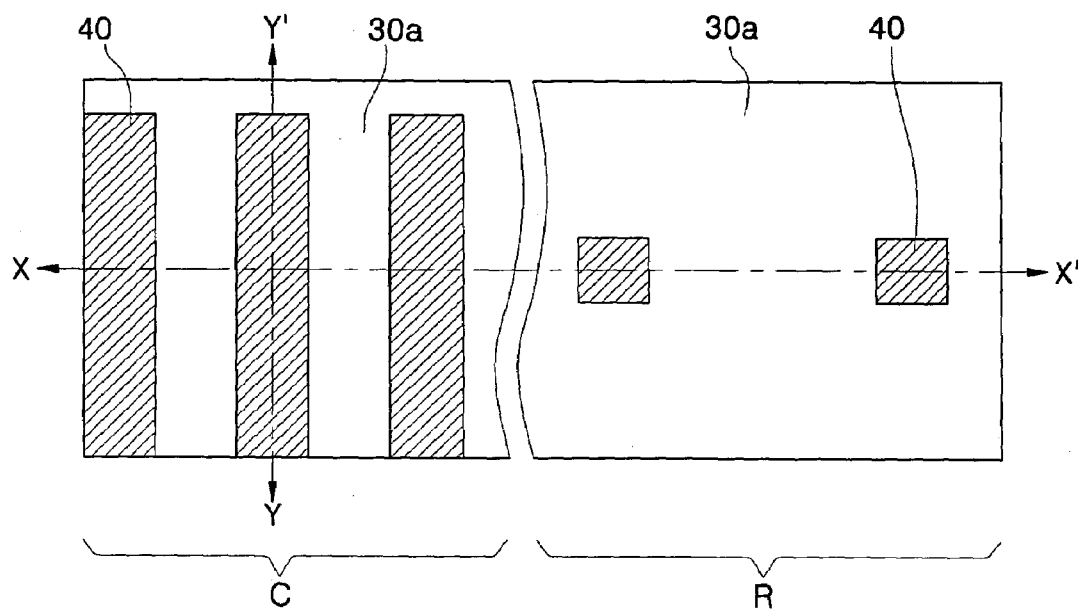
Figure 7B:
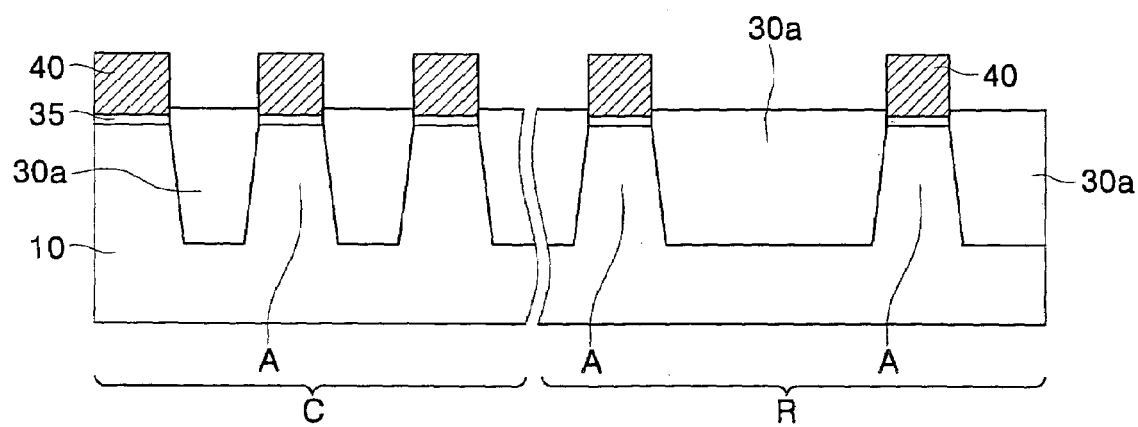
Figure 7C:
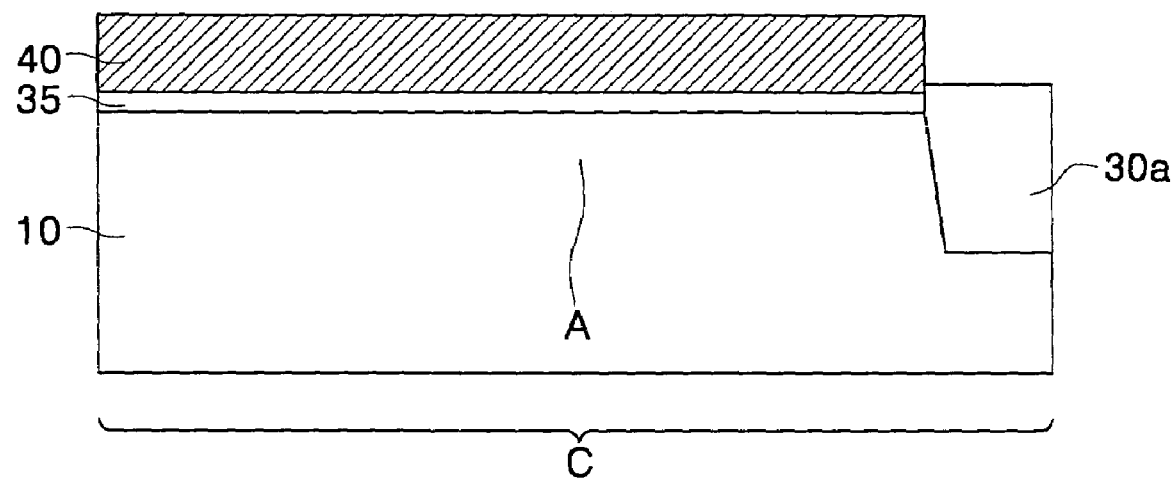

Referring to FIGS. 7A, 7B and 7C, the trench isolation layer 30 is selectively etched using a wet etchant, thereby forming a recessed trench isolation layer 30a. Preferably, the recessed trench isolation layer 30a exposes sidewalls of the floating gate patterns 40 but does not expose sidewalls of the gate oxide layer 35.

Figure 8A:
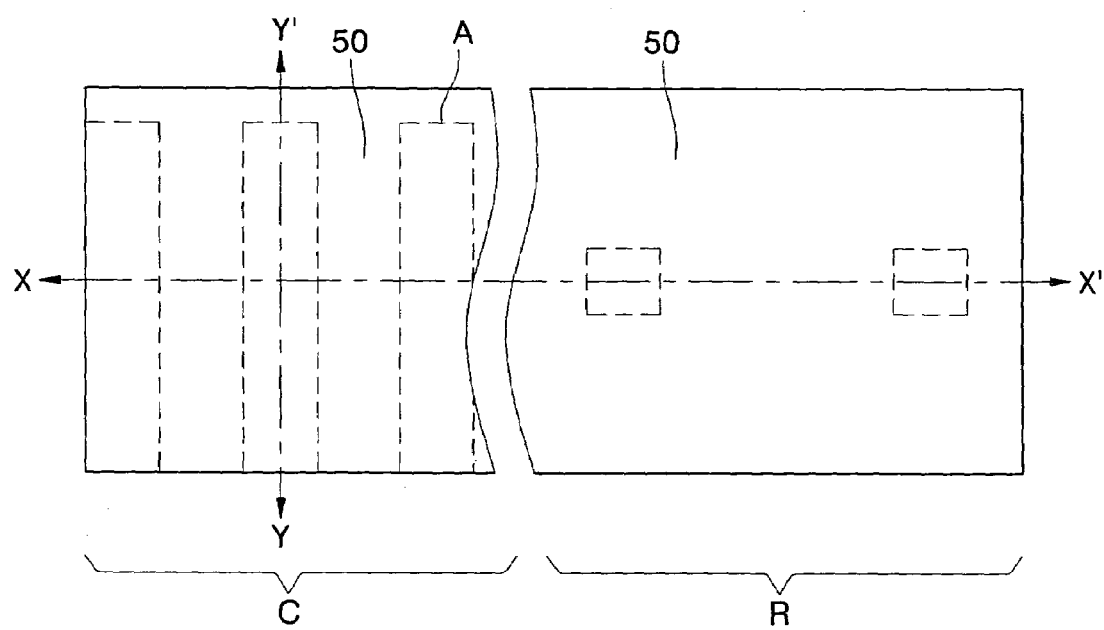
Figure 8B:
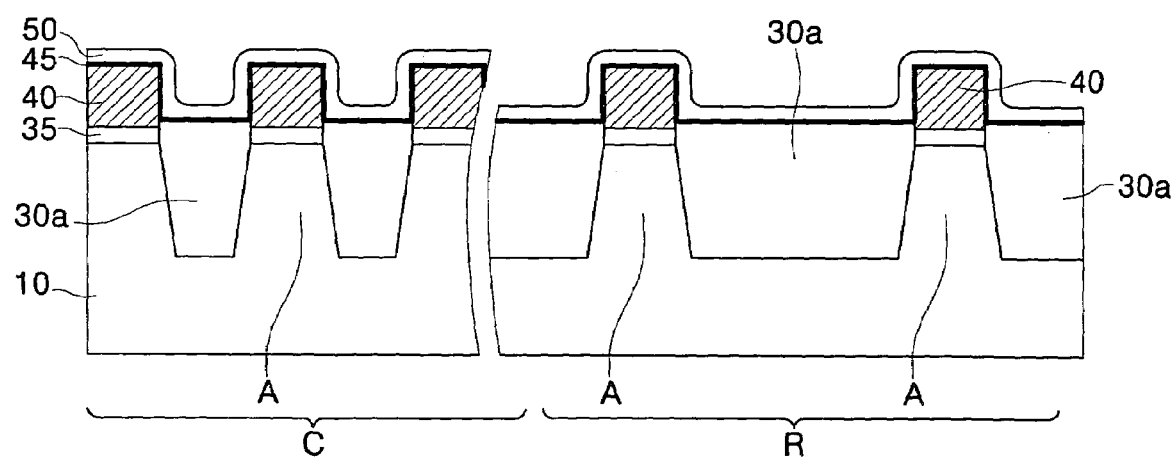
Figure 8C:
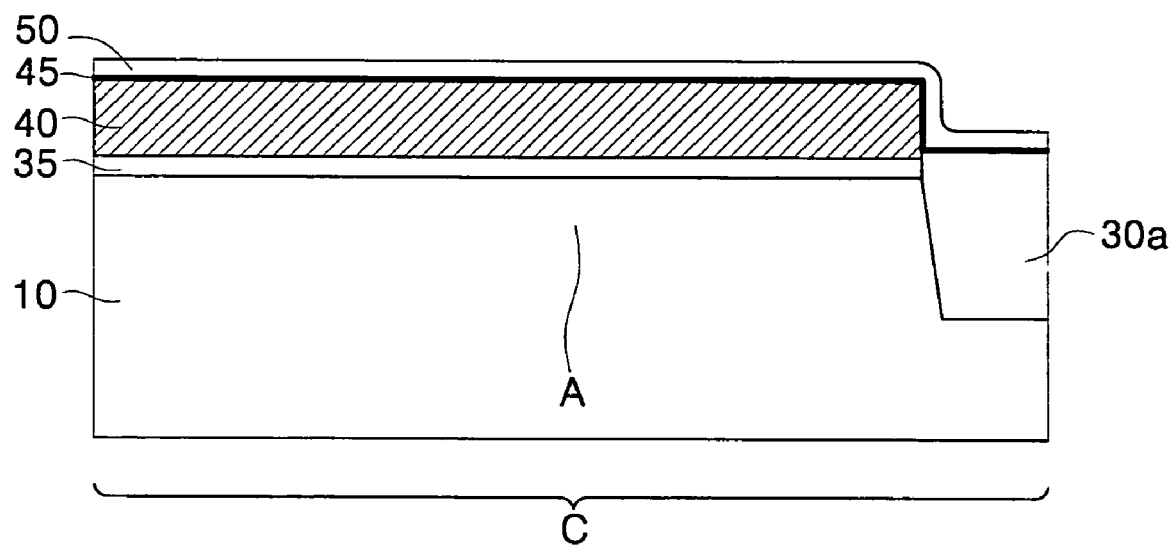

Referring to FIGS. 8A, 8B and 8C, a conformal oxide-nitride-oxide (ONO) layer 45 and a first control gate layer 50 are sequentially formed as a gate interlayer insulating layer on the semiconductor substrate 10 having the floating gate patterns 40. The first control gate layer 50 may be composed of polysilicon or may include polysilicon.

Figure 9A:
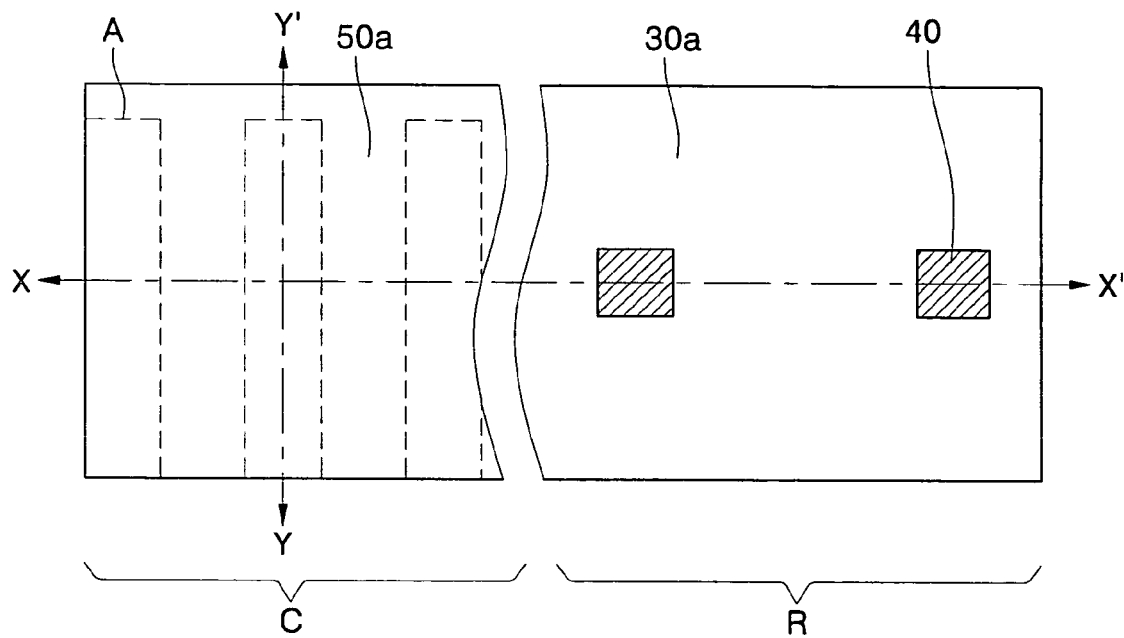
Figure 9B:
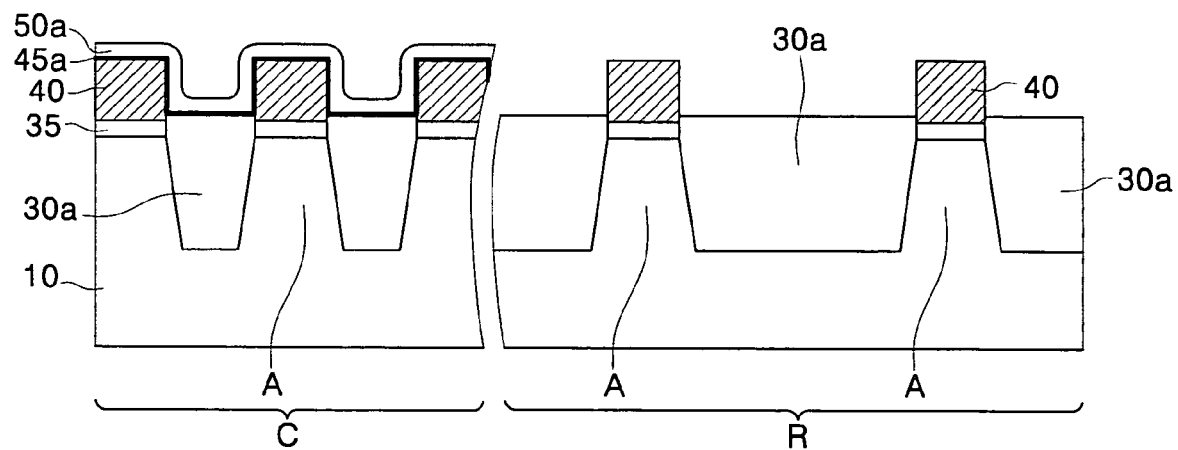
Figure 9C:
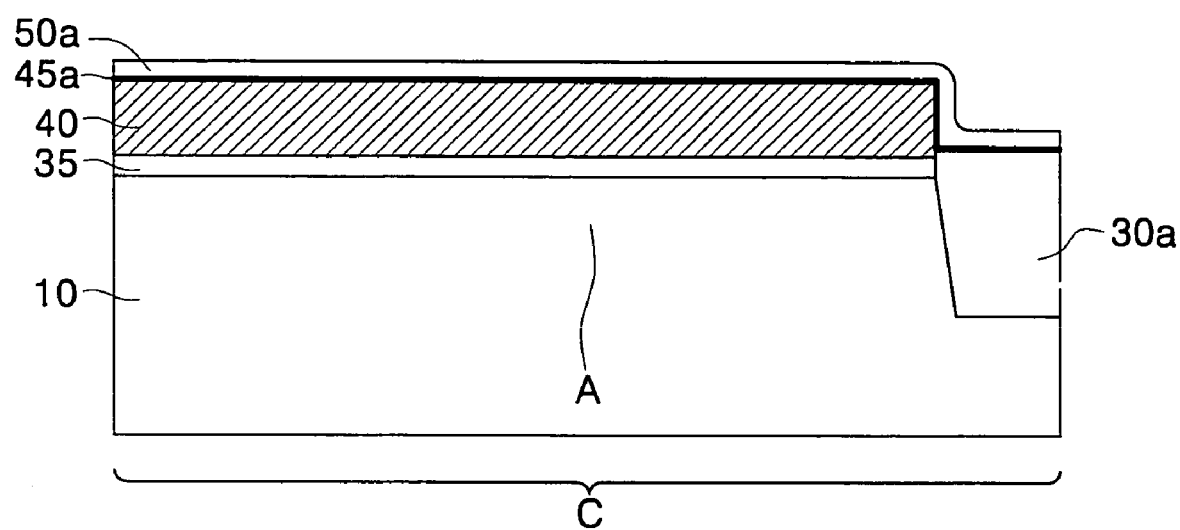

Referring to FIGS. 9A, 9B and 9C, the first control gate layer 50 is patterned to form a first control gate pattern 50a that exposes the resistor region R. The ONO layer 45 is patterned using the first control gate pattern 50a as an etch mask, thereby forming an ONO layer 45a that exposes the resistor region R. After the ONO layer 45a is formed, the first control gate pattern 50a may be formed to a final thickness of about 100 to 300 Å.

Figure 10A:
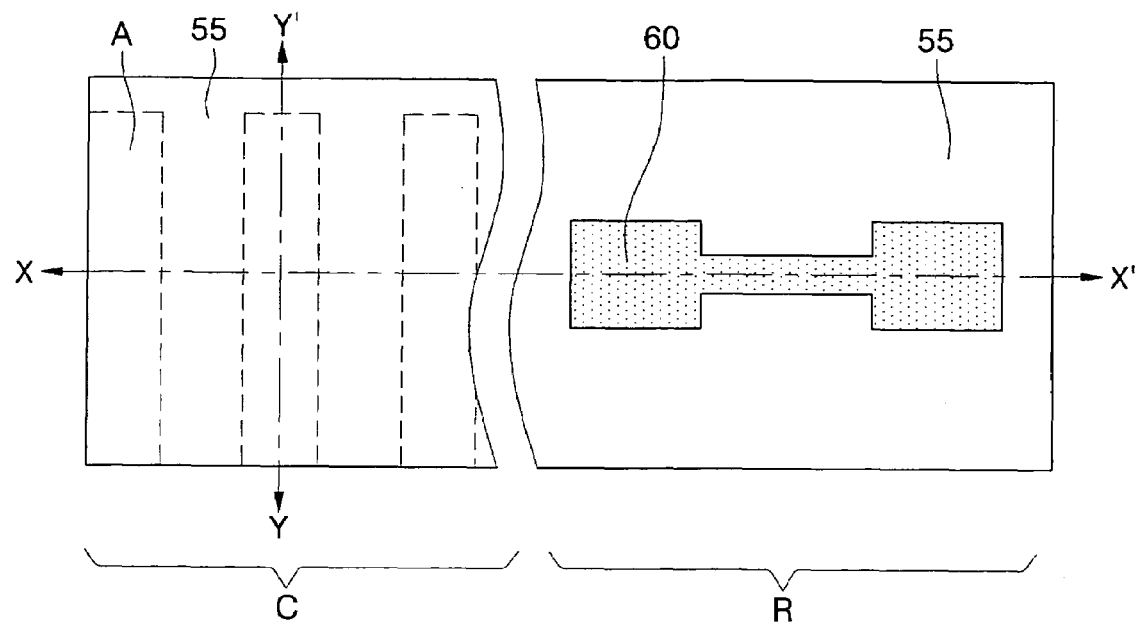
Figure 10B:
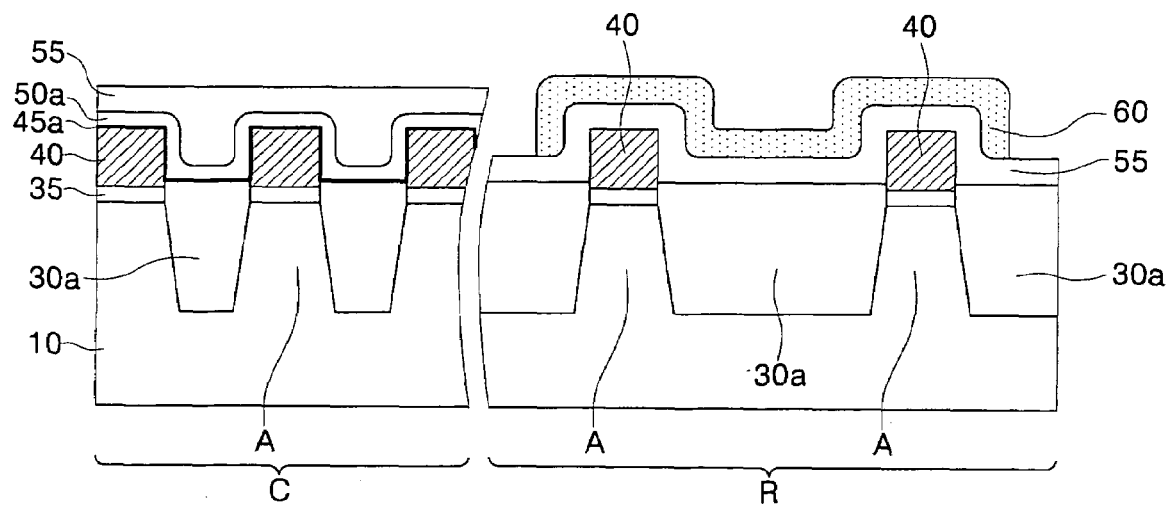
Figure 10C:
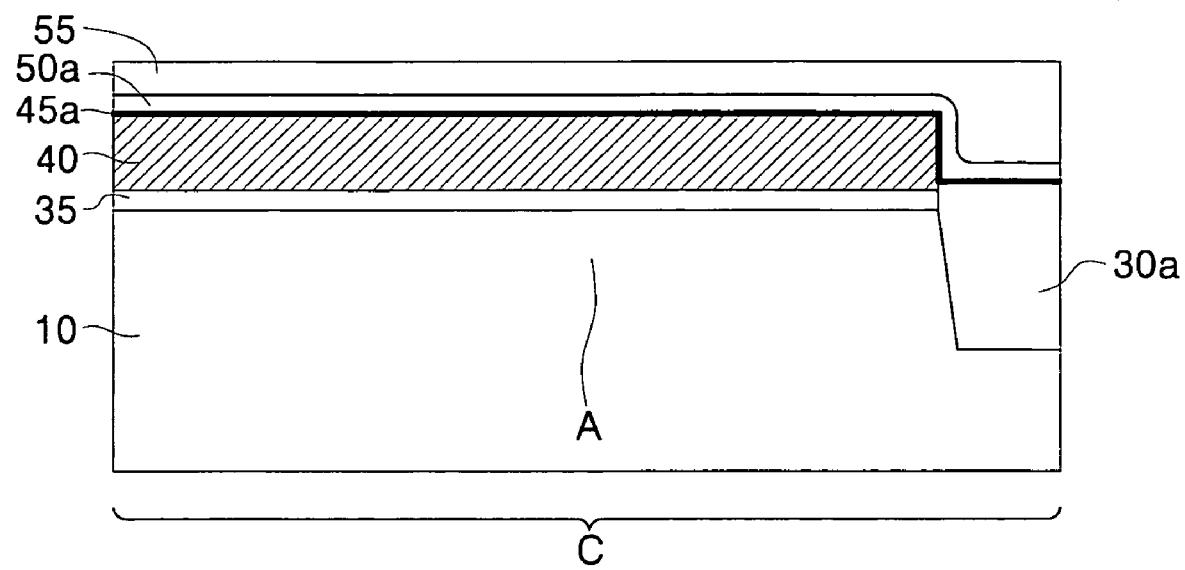

Referring to FIGS. 10A, 10B and 10C, a second control gate layer 55 is formed on the semiconductor substrate 10 having the first control gate pattern 50a. The second control gate layer 55 may be composed of polysilicon or may include polysilicon. The second control gate layer 55 may be formed to a thickness of about 200 to 700 Å. A resistor mask layer is formed on the second control gate layer 55 and patterned, thereby forming a resistor mask pattern 60 on the second control gate layer 55 formed in the resistor region R. The resistor mask pattern 60 is formed over the first conductive layer patterns 40 and the isolation layer 30a interposed between the first conductive layer patterns 40 in the resistor region R. Also, the resistor mask pattern 60 may have the same planar shape as a load resistor. The resistor mask pattern 60 may be formed of a silicon oxide layer. Preferably, the resistor mask pattern 60 may be formed of an MTO layer.

Figure 11A:
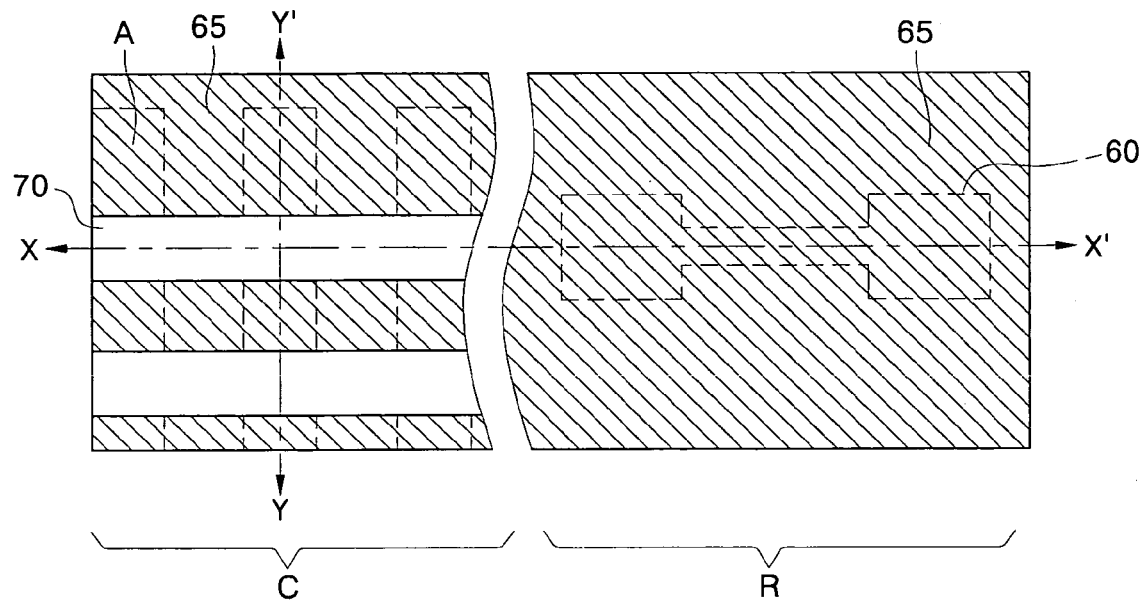
Figure 11B:
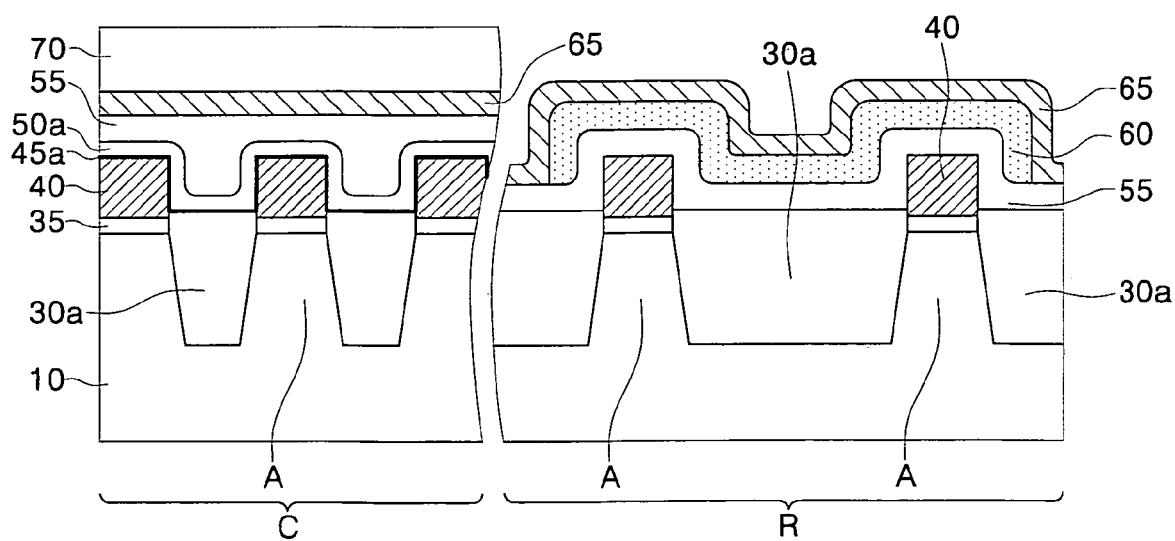
Figure 11C:
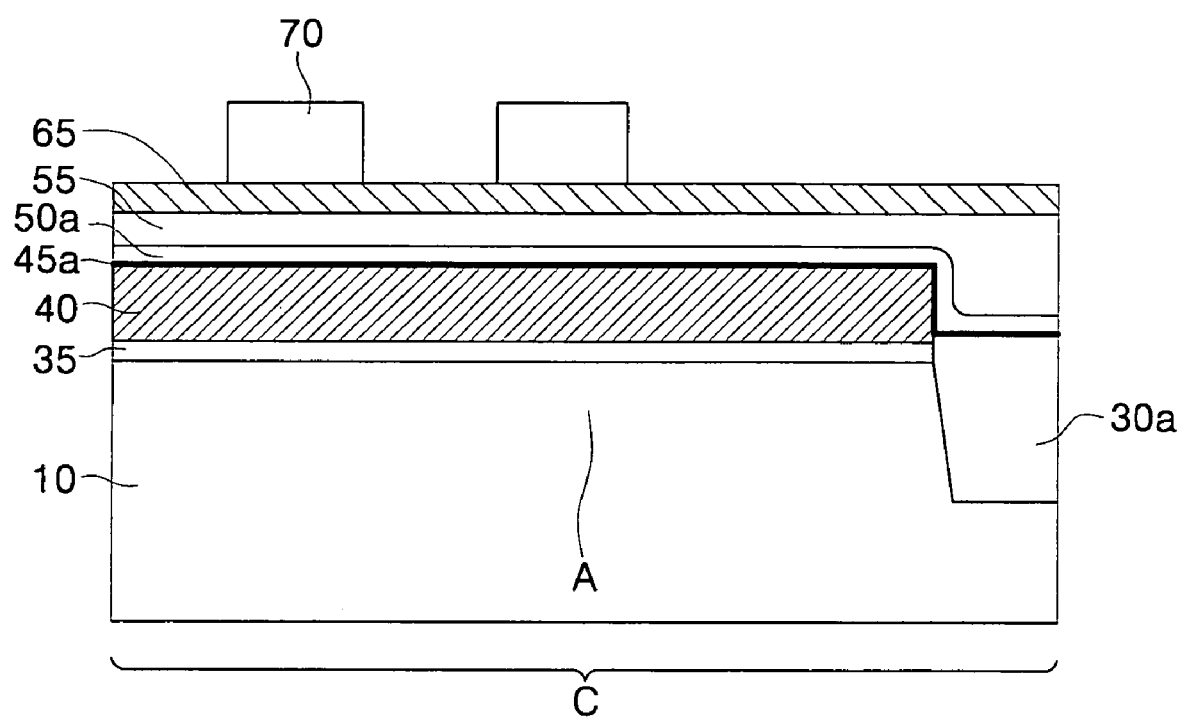

Referring to FIGS. 11A, 11B and 11C, a gate conductive layer 65 and a gate hard mask layer are sequentially formed on the surface of the semiconductor substrate 10 having the resistor mask pattern 60. The gate hard mask layer is patterned, thereby forming a gate hard mask pattern 70 that crosses the active regions A formed in the cell region C. In this case, the resistor region R is exposed. The gate conductive layer 65 may be a metal silicide layer, such as a tungsten silicide layer, a cobalt silicide layer, or a nickel silicide layer. Also, the gate conductive layer 65 may be formed of a metal such as tungsten. The gate hard mask pattern 70 may be formed of a silicon nitride layer.

Figure 12A:
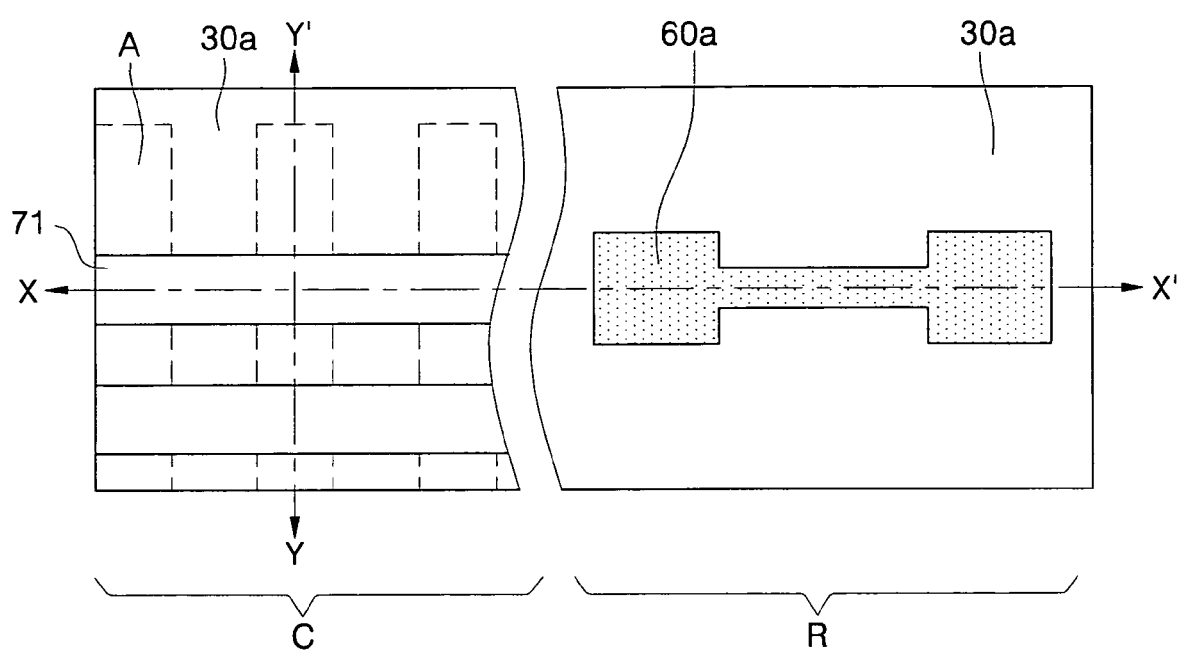
Figure 12B:
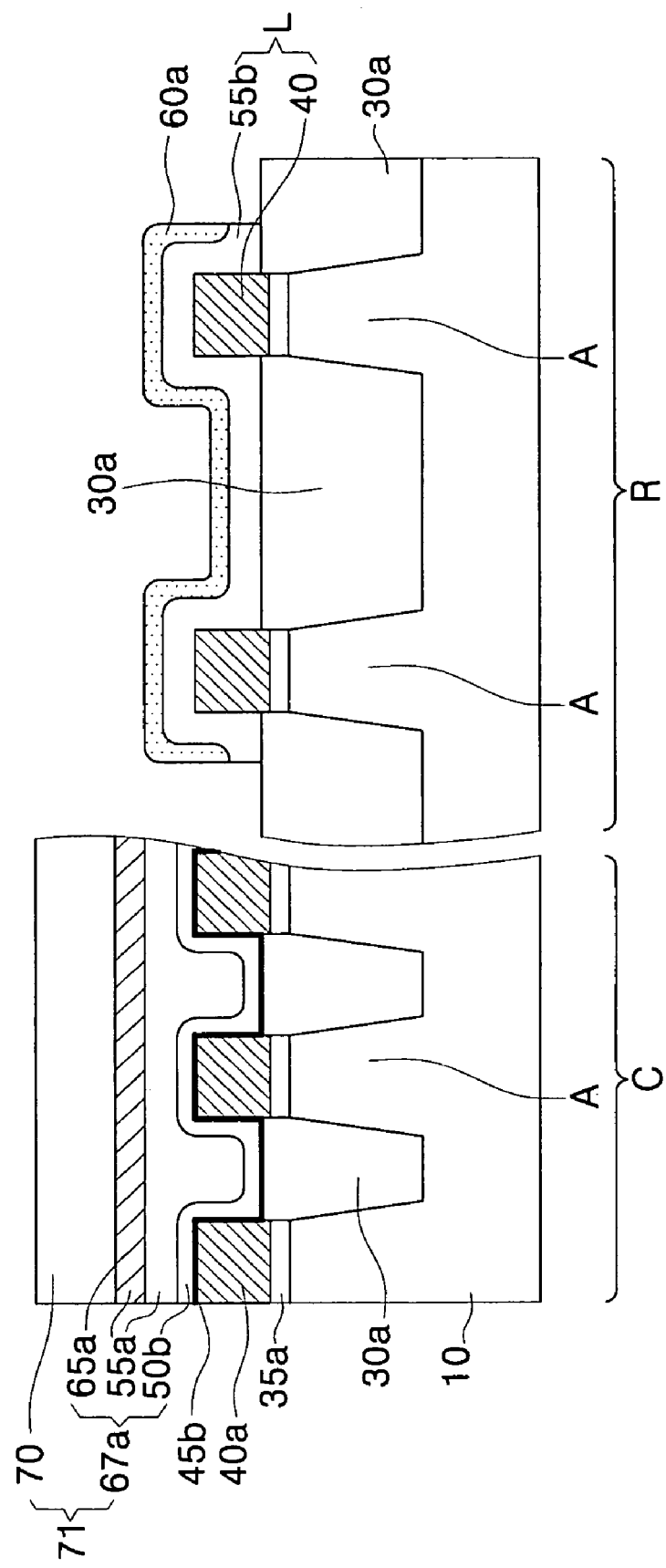
Figure 12C:
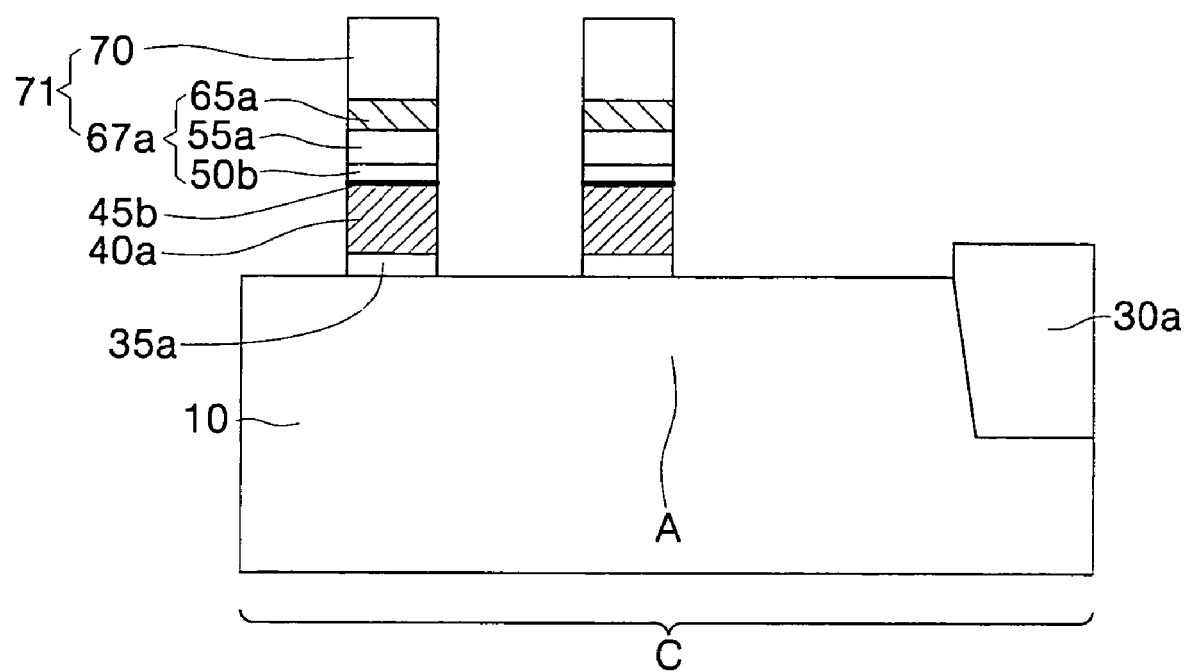

Referring to FIGS. 12A, 12B and 12C, the gate conductive layer 65, the second control gate layer 55, and the first control gate pattern 50a in the cell region C are sequentially etched using the gate hard mask pattern 70 as an etch mask until the ONO layer 45a is exposed. Thus, a control gate electrode 67a is formed across the active regions A formed in the cell region C. In this case, the ONO layer 45a may be used as an etch stop layer in the cell region C. The control gate electrode 67a includes a first control gate pattern 50b, a second control gate pattern 55a, and a gate conductive layer pattern 65a, which are sequentially stacked.

Subsequently, the ONO layer 45a and the floating gate pattern 40 in the cell region C are sequentially etched using the gate hard mask pattern 70 as the etch mask again, thereby forming an ONO layer pattern 45b and a floating gate electrode 40a. As a result, the floating gate electrode 40a, the ONO layer pattern 45b, the control gate electrode 67a, and the gate hard mask pattern 70 are sequentially formed. The floating gate electrode 40a, the ONO layer pattern 45b, and the control gate electrode 67a form a stacked gate structure. Also, the control gate electrode 67a and the gate hard mask pattern 70 form a word line pattern 71. In this case, the gate oxide layer 35 may also be etched. As a result, a gate oxide layer pattern 35a may be formed.

While the word line pattern 71, the ONO layer pattern 45b, and the floating gate pattern 40a are formed, the gate conductive layer pattern 65 and the second control gate layer 55 in the resistor region R may be etched. In this case, the resistor mask pattern 60 functions as an etch stop layer so that a self-aligned second conductive layer pattern, i.e., a second control gate pattern 55b is formed under the resistor mask pattern 60. In other words, the second control gate pattern 55b is self-aligned with the resistor mask pattern 60. Thus, the second control gate pattern 55b is formed on the floating gate patterns 40 and the isolation layer 30a interposed between the floating gate patterns.

The resistor mask pattern 60 may be over-etched during the formation of the second control gate pattern 55b. As a result, a resistor mask pattern 60a that is thinner than the initial resistor mask pattern 60 may remain on the second control gate pattern 55b. Accordingly, when the resistor mask pattern 60 is formed as described with reference to FIG. 10, the thickness of the resistor mask pattern 60 may be determined in consideration of a thickness to be etched during a subsequent process. The floating gate pattern 40 and the second control gate pattern 55b, which are sequentially stacked in the resistor region R, form a load resistor pattern L. As described above, the load resistor pattern L may be self-aligned with the resistor mask pattern 60. Accordingly, the sidewalls of the load resistor pattern L may also be self-aligned with the sidewalls of the resistor mask pattern 60a.

Figure 13A:
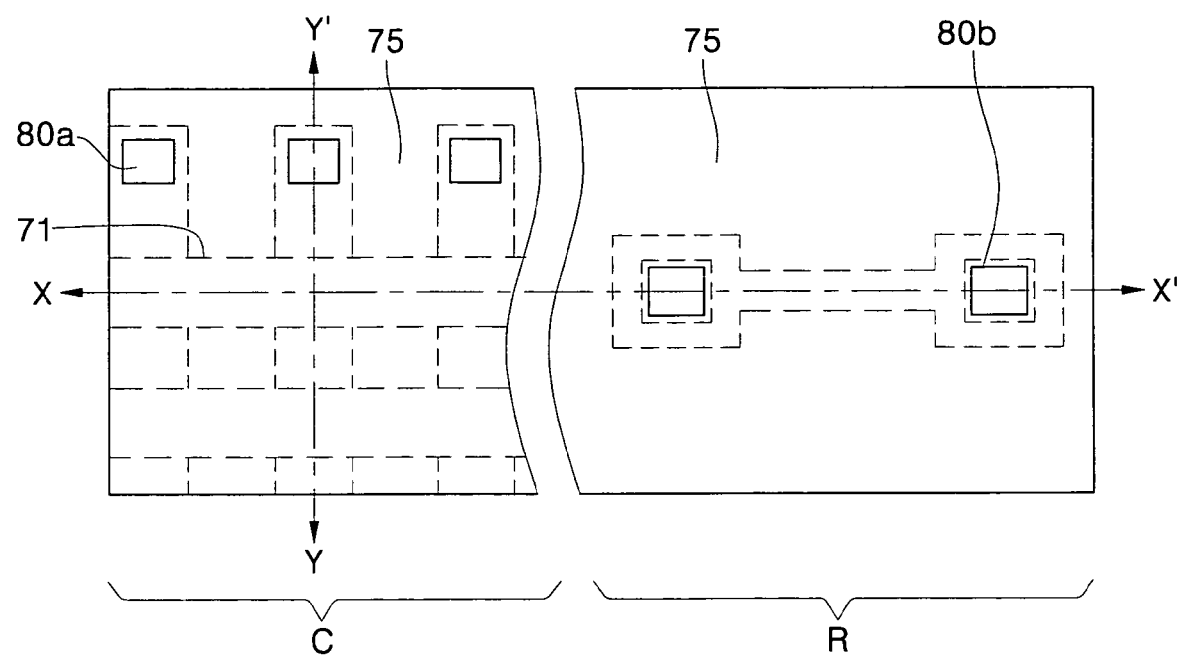
Figure 13B:
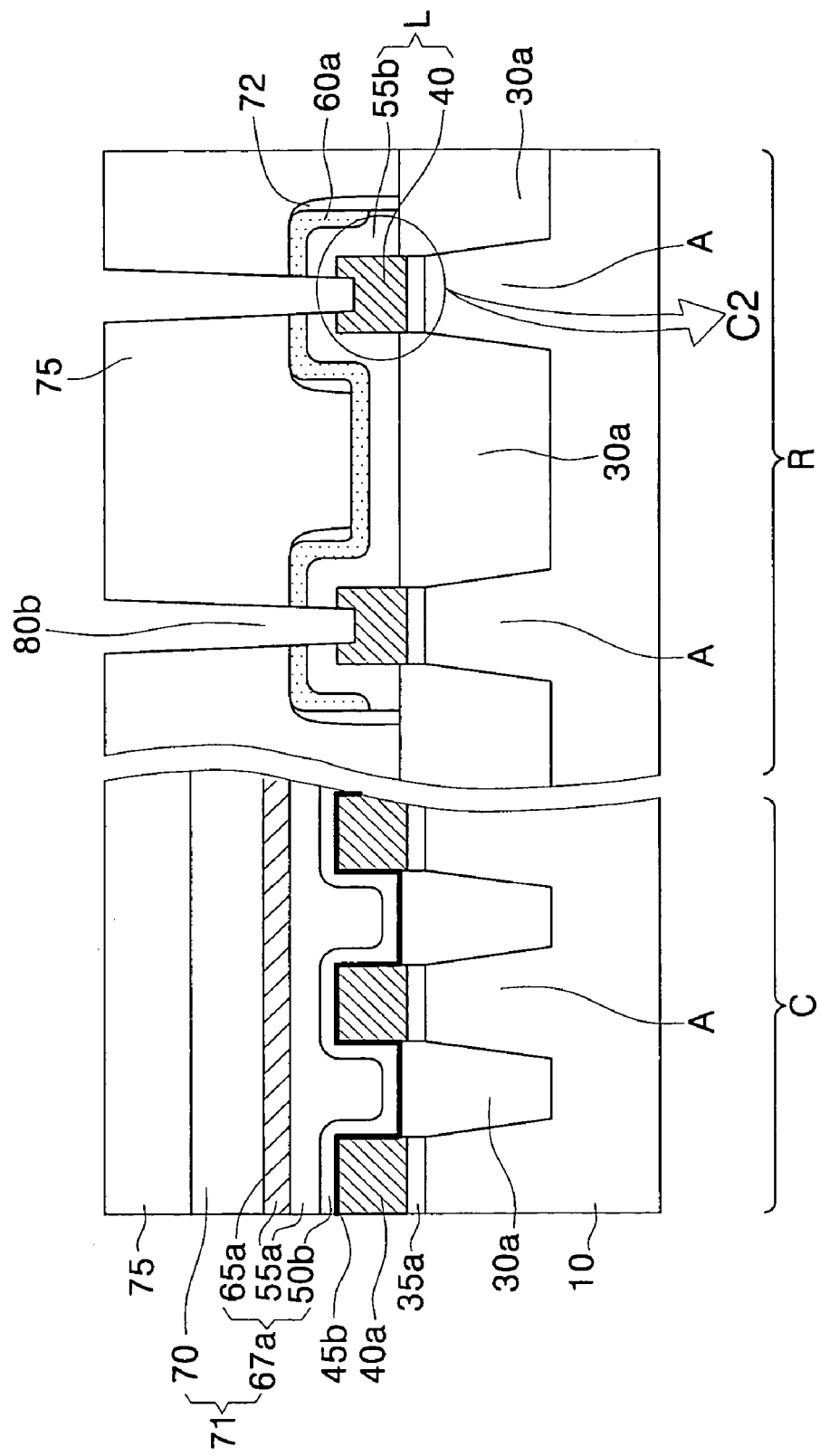
Figure 13C:
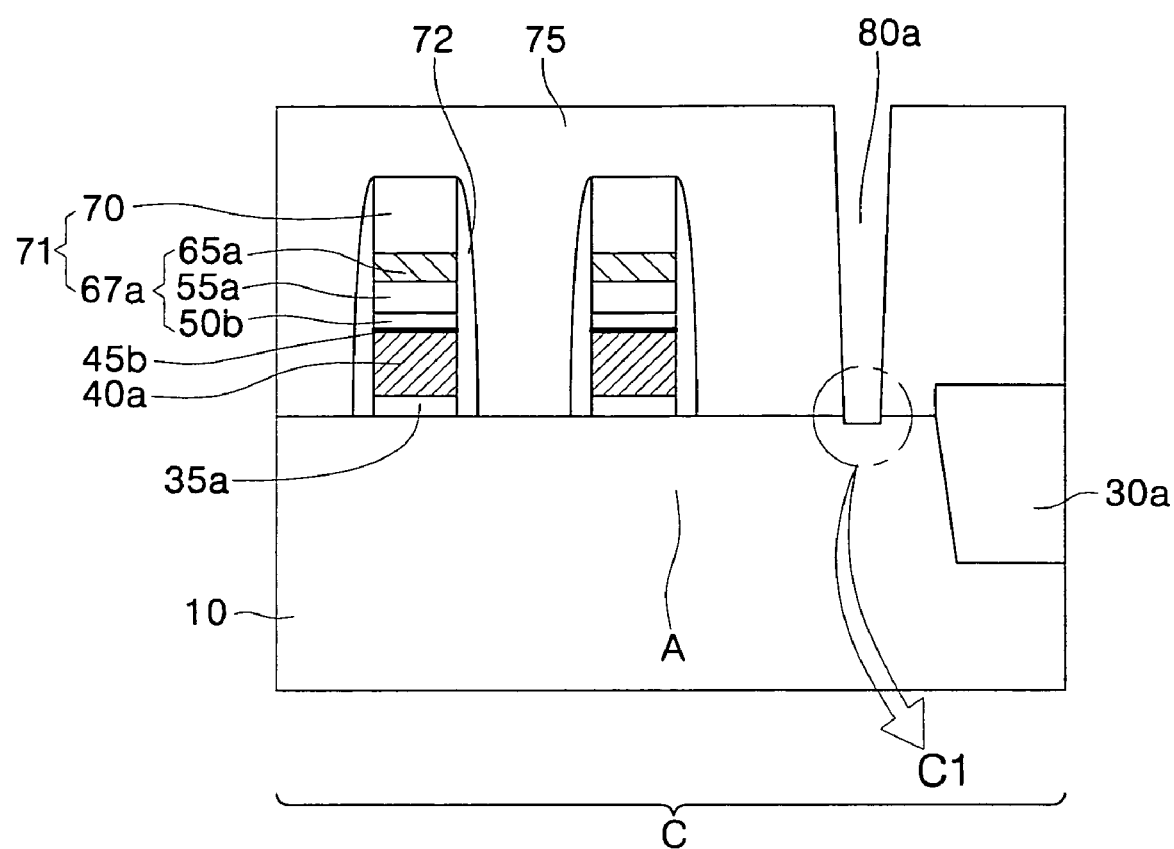

Referring to FIGS. 13A, 13B and 13C, a conformal spacer layer is formed on the semiconductor substrate 10 having the word line pattern 71 and the load resistor pattern L. An etchback process is performed on the semiconductor substrate 10 having the spacer layer so that gate spacers 72 are formed on sidewalls of the word line pattern 71 and the floating gate electrode 40a. In this case, the spacers 72 may also be formed on the sidewalls of the load resistor pattern L and the sidewalls of the resistor mask pattern 60a.

Thereafter, an interlayer insulating layer is formed to cover the word line pattern 71 and the load resistor pattern L. The interlayer insulating layer is planarized to form a planarized interlayer insulating layer 75. A bit line contact hole 80a is formed through the planarized interlayer insulating layer 75 formed in the cell region C so that the active region A formed in the cell region C is exposed. When the bit line contact hole 80a is formed, a pair of resistor contact holes 80b are formed through at least the planarized interlayer insulating layer 75 and the resistor mask pattern 60a in the resistor region R. The resistor contact holes 80b are formed in upper portions of the floating gate patterns 40, i.e., the first conductive layer patterns. Accordingly, the resistor contact holes 80b may expose the second control gate pattern 55b, i.e., the second conductive layer pattern formed on the first conductive layer patterns 40.

As can be seen in the region 'C1' of FIG. 13C, the bit line contact hole 80a may be formed by recessing the semiconductor substrate 10 in the active region A to a depth of about 200 to 300 Å. In other words, when the bit line contact hole 80a is formed, the planarized interlayer insulating layer 75 may be over-etched to completely expose the active region A in the cell region C. This is because the thickness and etch rate of the planarized interlayer insulating layer 75 may not be uniform throughout the semiconductor substrate 10. In this case, the second control gate pattern 55b formed in the resistor region R may also be over-etched. Nevertheless, the floating gate patterns 40 provided under the resistor contact holes 80b can prevent the resistor contact holes 80b from exposing the semiconductor substrate 10, i.e., the active region A in the resistor region R. Consequently, even if the planarized interlayer insulating layer 75 is over-etched during the formation of the bit line contact hole 80a and the resistor contact holes 80b, the method of the present invention may prevent the resistor contact holes 80b from penetrating the floating gate patterns 40. Accordingly, even if the planarized interlayer insulating layer 75 is severely over-etched, the resistor contact holes 80b may expose the floating gate patterns 40 through the second control gate pattern 55b as can be seen in the region 'C2' of FIG. 13B. As a result, no contact failure occurs in the load resistor pattern L. Thus, embodiments of the invention may increase a contact margin of the load resistor pattern L.

Figure 14A:
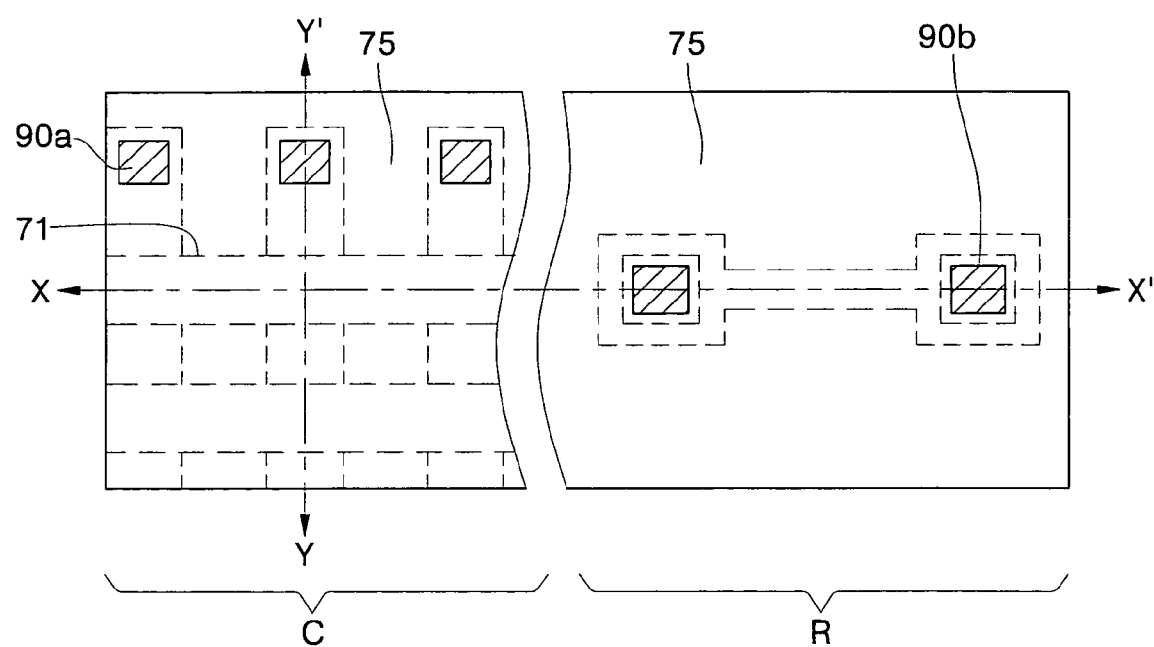
Figure 14B:
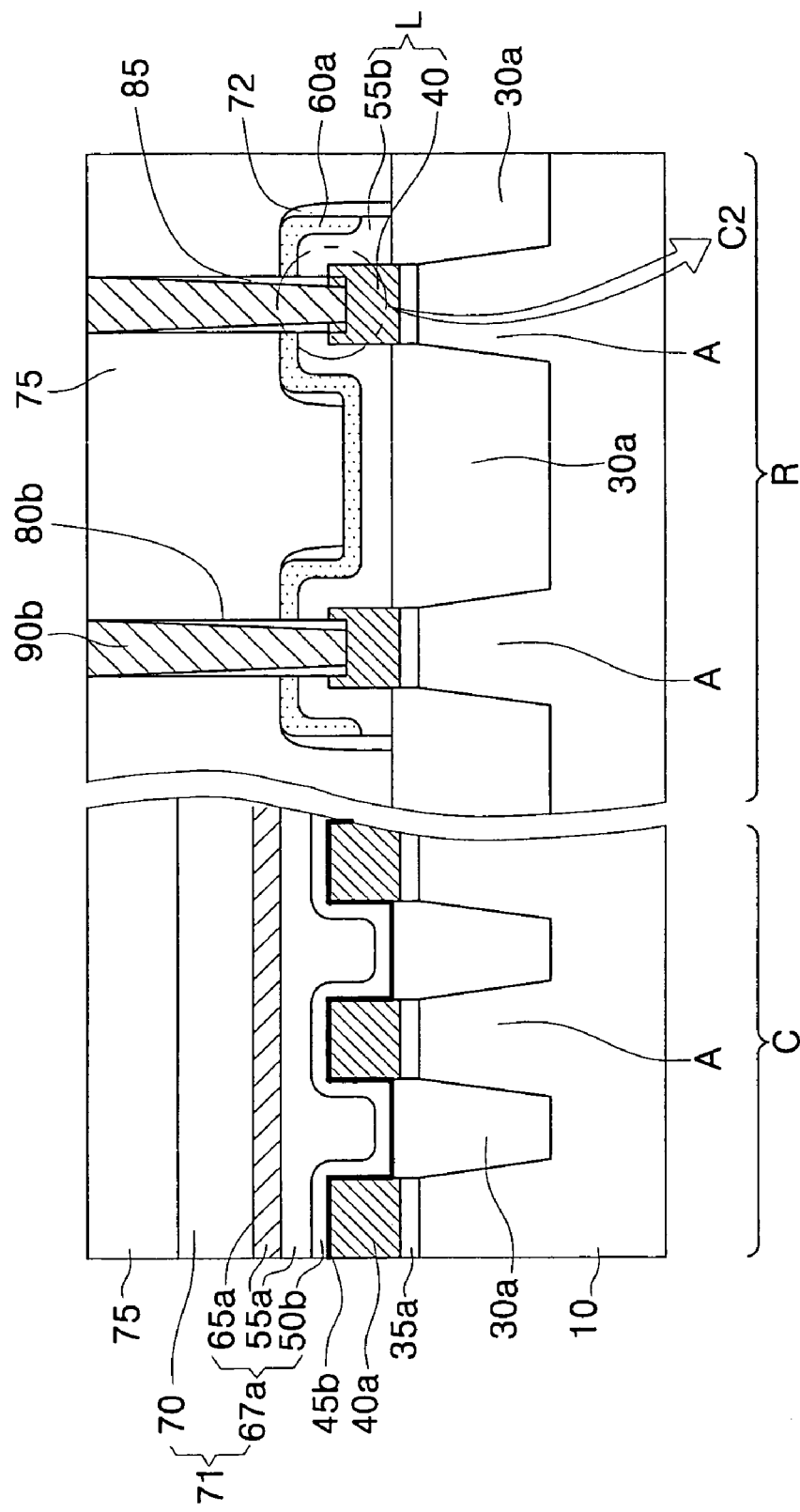
Figure 14C:
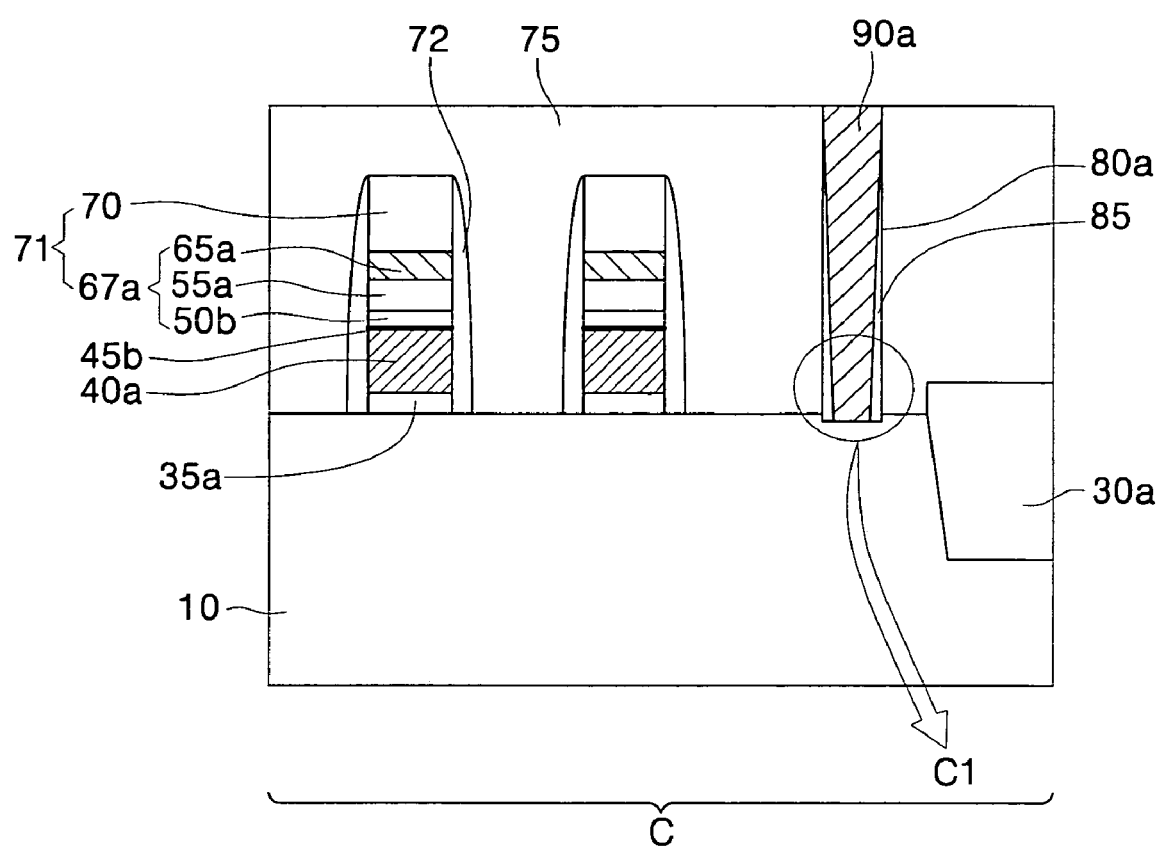

Referring to FIGS. 14A, 14B and 14C, a conformal silicon nitride layer may be formed on the semiconductor substrate 10 having the bit line contact hole 80a and the resistor contact holes 80b. After that, an etchback process may be carried out to form spacer nitride layers 85 on sidewalls of the bit line contact hole 80a and the resistor contact holes 80b.

A conductive layer is formed on the semiconductor substrate 10 having the spacer nitride layer 85 to fill the bit line contact hole 80a and the resistor contact holes 80b. The conductive layer may be formed of a metal layer. Thereafter, the conductive layer is planarized until the interlayer insulating layer 75 is exposed. Thus, a bit line contact plug 90a and resistor contact plugs 90b are formed in the bit line contact hole 80a and the resistor contact holes 80b, respectively.

As can be seen in the region 'C2' of FIG. 14B, the resistor contact plugs 90b are in contact with the floating gate patterns 40 to be electrically connected to the load resistor pattern L. Accordingly, compared to the conventional technique, a contact margin is increased by as much as the thickness of the floating gate patterns 40, thus contact failures can be prevented.

According to the embodiments of the invention described above, active regions, an insulating layer, and a first conductive layer are formed in a portion where a contact will be formed in a resistor region, and then a second conductive layer is formed thereon. Thus, a load resistor pattern formed of the first and second conductive layers is obtained. As a result, compared to conventional methods, the thickness of the load resistor pattern in the portion where the contact is formed is increased by as much as the thickness of the first conductive layer so that a sufficient contact margin can be ensured. Therefore, embodiments may prevent contact failures in the load resistor pattern, which leads to an increase in the yield.

The invention may be practiced in many ways. What follows are exemplary, non-limiting descriptions of some embodiments of the invention.

According to some embodiments, a semiconductor device includes a load resistor. The semiconductor device further includes a semiconductor substrate having a resistor region. An isolation layer is disposed in the resistor region of the semiconductor substrate to define at least a pair of active regions. First conductive layer patterns are disposed on the active regions. The first conductive layer patterns and the isolation layer are covered with a second conductive layer pattern. The first conductive layer patterns and the second conductive layer pattern form a load resistor pattern. An upper insulating layer is disposed over the load resistor pattern. The load resistor pattern is in contact with resistor contact plugs that are formed through the upper insulating layer. The resistor contact plugs are disposed over the active regions.

According to some embodiments, a lower insulating layer may be disposed between the first conductive layer patterns and the active regions. The lower insulating layer may be a high-voltage gate oxide layer.

According to some embodiments, the upper insulating layer may include a resistor mask pattern and a planarized insulating layer, which are disposed on the load resistor pattern. Also, sidewalls of the load resistor pattern may be self-aligned with sidewalls of the resistor mask pattern.

According to some embodiments, the resistor contact plugs may be in contact with the first conductive layer patterns.

According to some embodiments, the first conductive layer patterns may be a polysilicon layer.

According to some embodiments, the second conductive layer pattern may be a polysilicon layer.

According to some embodiments, sidewalls of the resistor contact plugs may be covered with spacer nitride layers.

According to some embodiments, the first conductive layer patterns may be self-aligned with the isolation layer.

According to other embodiments of the invention, a nonvolatile memory device includes a load resistor. The nonvolatile memory device further includes a semiconductor substrate having a cell region and a resistor region. An isolation layer is disposed on the semiconductor substrate and defines a cell active region and at least a pair of resistor active regions in the cell and resistor regions, respectively. A gate oxide layer is disposed on the cell active region. A stacked gate structure is disposed on the gate oxide layer and includes a floating gate electrode, a gate interlayer insulating layer, and a control gate electrode, which are sequentially stacked. First conductive layer patterns are disposed on the resistor active regions. A second conductive layer pattern is disposed in the resistor region. The second conductive layer pattern covers the first conductive layer patterns and the isolation layer. The first conductive layer patterns and the second conductive layer pattern form a load resistor pattern. An interlayer insulating layer is disposed over the load resistor pattern. The load resistor pattern is in contact with resistor contact plugs that are formed through the interlayer insulating layer. The resistor contact plugs are disposed over the resistor active regions.

According to some embodiments, the floating gate electrode may be the same material layer as the first conductive layer patterns.

According to some embodiments, the second conductive layer pattern may be the same material layer as a portion of material layers that form the control gate electrode.

According to some embodiments, the interlayer insulating layer may extend and cover the cell region having the stacked gate structure. Further, a bit line contact plug, which is formed of the same material layer as the resistor contact plugs, may be disposed in the interlayer insulating layer of the cell region.

According to some embodiments, sidewalls of the resistor contact plugs may be covered with spacer nitride layers.

According to some embodiments, the first conductive layer patterns may be self-aligned with the isolation layer in the resistor region.

According to some embodiments, a method of fabricating a semiconductor device having a load resistor includes preparing a semiconductor substrate having a resistor region. A trench isolation layer is formed in the semiconductor substrate to define at least a pair of active regions, and an insulating layer and first conductive layer patterns are sequentially stacked on the active regions to be self-aligned with the trench isolation layer. A second conductive layer is formed on the semiconductor substrate having the first conductive layer patterns. The second conductive layer is patterned, thereby forming a second conductive layer pattern that covers the first conductive layer patterns and the isolation layer interposed therebetween. The first conductive layer patterns and the second conductive layer pattern form a load resistor pattern. A planarized interlayer insulating layer is formed on the semiconductor substrate having the load resistor pattern. Resistor contact holes are formed through the planarized interlayer insulating layer over the active regions. Resistor contact plugs are formed to fill the resistor contact holes and contact the load resistor pattern.

According to some embodiments, the formation of the trench isolation layer, the insulating layer, and the first conductive layer patterns may include forming a pad oxide layer on the semiconductor substrate, forming a hard mask pattern on the pad oxide layer, the hard mask pattern having an opening that exposes a predetermined region of the pad oxide layer, etching the pad oxide layer and the semiconductor substrate using the hard mask pattern as an etch mask to form a trench for defining at least a pair of active regions, forming a trench isolation layer which fills the opening and the trench, selectively removing the hard mask pattern and the pad oxide layer, forming an insulating layer on the active regions, forming a first conductive layer on the semiconductor substrate having the insulating layer, and planarizing the first conductive layer to expose a surface of the trench isolation layer and form first conductive layer patterns on the active regions.

According to some embodiments, the insulating layer may be formed of a high-voltage gate oxide layer.

According to some embodiments, the first conductive layer patterns may be formed of a polysilicon layer.

According to some embodiments, the first conductive layer patterns may be formed to a thickness of about 500 to 1000 Å.

According to some embodiments, the second conductive layer may be formed of a polysilicon layer.

According to some embodiments, the second conductive layer may be formed to a thickness of about 200 to 700 Å.

According to some embodiments, the resistor contact holes may expose the first conductive layer patterns.

According to some embodiments, spacer nitride layers may be formed on sidewalls of the resistor contact holes.

According to some embodiments, the formation of the second conductive layer pattern may include: forming a resistor mask pattern on the second conductive layer; and etching the second conductive layer using the resistor mask pattern as an etch mask. The resistor mask pattern may be formed of a silicon oxide layer.

Exemplary embodiments of the invention have been disclosed herein and, although specific terms are employed, they are used and are to be interpreted in a generic and descriptive sense only and not for purpose of limitation. Accordingly, it will be understood by those of ordinary skill in the art that various changes in form and details may be made to the exemplary embodiments described above without departing from the inventive principles that are set forth in the attached claims.

The invention claimed is:

1. A method of fabricating a semiconductor device on a semiconductor substrate having a resistor region, the method comprising:

defining active regions in the resistor region of the semiconductor substrate with a trench isolation layer;

forming an insulating layer on the active regions, the insulating layer self-aligned with the trench isolation layer;

forming first conductive layer patterns on the insulating layer, the first conductive layer patterns self-aligned with the trench isolation layer;

forming a second conductive layer on the semiconductor substrate having the first conductive layer patterns;

patterning the second conductive layer to form a second conductive layer pattern that covers the first conductive layer patterns and the isolation layer between the first conductive layer patterns, the first conductive layer patterns and the second conductive layer pattern forming a load resistor pattern;

forming a planarized interlayer insulating layer on the load resistor pattern;

exposing the load resistor pattern over the active regions with resistor contact holes, the resistor contact holes formed through the planarized interlayer insulating layer; and filling the resistor contact holes with resistor contact plugs that contact the load resistor pattern.

2. The method according to claim 1, wherein defining the active regions, forming the insulating layer, and forming the first conductive layer pattern comprises:

forming a pad oxide layer on the semiconductor substrate;

forming a hard mask pattern on the pad oxide layer, the hard mask pattern having an opening that exposes a predetermined region of the pad oxide layer;

etching the pad oxide layer and the semiconductor substrate using the hard mask pattern as an etch mask to form a trench that defines the active regions;

filling the opening and the trench with the trench isolation layer;

selectively removing the hard mask pattern and the pad oxide layer;

forming the insulating layer on the active regions;

forming a first conductive layer on the semiconductor substrate having the insulating layer; and planarizing the first conductive layer to expose a surface of the trench isolation layer and to form the first conductive layer patterns.

3. The method of claim 1, wherein the insulating layer comprises a high-voltage gate insulating layer.

4. The method of claim 1, wherein the first conductive layer patterns comprise polysilicon.

5. The method of claim 1, wherein the first conductive layer patterns are formed to a thickness of about 500 to about 1000 Å.

6. The method of claim 1, wherein the second conductive layer comprises polysilicon.

7. The method of claim 1, wherein the second conductive layer is formed to a thickness of about 200 to about 700 Å.

8. The method of claim 1, wherein exposing the load resistor pattern comprises exposing the first conductive layer patterns.

9. The method of claim 1, further comprising forming spacer nitride layers on sidewalls of the resistor contact holes.

10. The method of claim 1, wherein patterning the second conductive layer pattern comprises:

forming a resistor mask pattern on the second conductive layer; and etching the second conductive layer using the resistor mask pattern as an etch mask.

11. The method of claim 10, wherein the resistor mask pattern comprises silicon oxide.

* * * * *